United States Patent
Kim et al.

(10) Patent No.: US 10,734,042 B2
(45) Date of Patent: Aug. 4, 2020

(54) SEMICONDUCTOR DEVICES

(71) Applicant: SK hynix Inc., Icheon-si, Gyeonggi-do (KR)

(72) Inventors: Woongrae Kim, Icheon-si (KR); Myung Kyun Kwak, Yongin-si (KR); Seung Hun Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/506,648

(22) Filed: Jul. 9, 2019

(65) Prior Publication Data

US 2020/0176035 A1 Jun. 4, 2020

(30) Foreign Application Priority Data

Dec. 3, 2018 (KR) .................. 10-2018-0153937

(51) Int. Cl.
*G11C 7/22* (2006.01)
*G11C 7/10* (2006.01)

(52) U.S. Cl.
CPC .......... *G11C 7/109* (2013.01); *G11C 7/1087* (2013.01); *G11C 7/1096* (2013.01); *G11C 7/222* (2013.01); *G11C 2207/229* (2013.01)

(58) Field of Classification Search
CPC ...................................... G11C 7/22
USPC ...................................... 365/203
See application file for complete search history.

(56) References Cited

U.S. PATENT DOCUMENTS

| 6,163,832 A | 12/2000 | Okajima | |
|---|---|---|---|
| 6,801,468 B1 * | 10/2004 | Lee | G11C 11/406 365/222 |
| 9,659,615 B1 * | 5/2017 | Kwak | G11C 7/12 |
| 9,953,688 B1 * | 4/2018 | Min | G11C 7/10 |
| 2003/0112694 A1 * | 6/2003 | Lee | G11C 11/4094 365/230.03 |
| 2009/0059700 A1 * | 3/2009 | Yoo | G11C 7/1018 365/203 |
| 2010/0110813 A1 * | 5/2010 | Wilson | G11C 7/1078 365/203 |
| 2011/0158020 A1 * | 6/2011 | Hwang | G11C 7/22 365/203 |
| 2015/0213856 A1 * | 7/2015 | Park | G11C 7/1048 365/203 |

FOREIGN PATENT DOCUMENTS

KR 1020170109142 A 9/2017

* cited by examiner

*Primary Examiner* — Min Huang
(74) *Attorney, Agent, or Firm* — William Park & Associates, Ltd.

(57) ABSTRACT

A semiconductor device includes an input/output (I/O) control signal generation circuit, a pipe circuit and an auto-pre-charge signal generation circuit. The I/O control signal generation circuit generates an input control signal, an output control signal and an internal output control signal. The pipe circuit latches an internal command/address signal based on the input control signal and outputs the latched internal command/address signal as a latch signal. The auto-pre-charge signal generation circuit generates an auto-pre-charge signal from the latch signal and the internal latch signal.

20 Claims, 17 Drawing Sheets

FIG.13
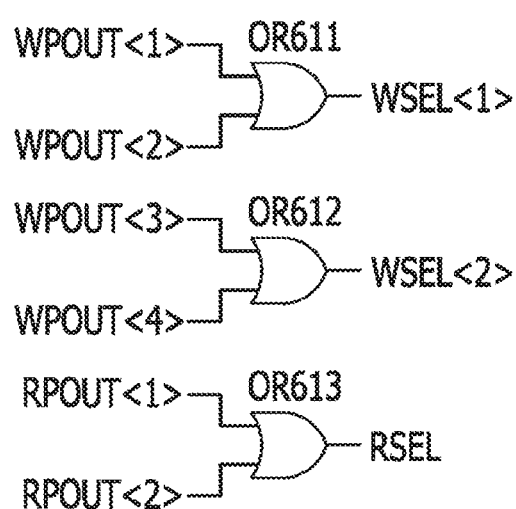
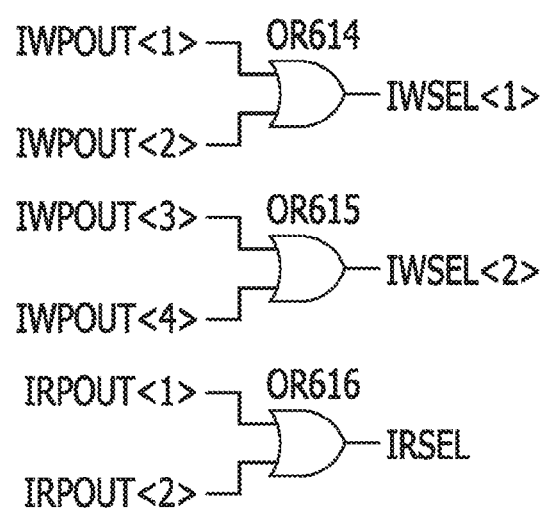

SEMICONDUCTOR DEVICES

CROSS-REFERENCE TO RELATED APPLICATIONS

The present application claims priority under 35 U.S.C 119(a) to Korean Application No. 10-2018-0153937, filed on Dec. 3, 2018, which is incorporated herein by reference in its entirety.

BACKGROUND

1. Technical Field

Embodiments of the present disclosure relate to semiconductor devices performing an auto-pre-charge operation.

2. Related Art

Semiconductor devices perform a write operation, storing data into cell arrays, or perform a read operation, outputting the data stored in the cell arrays. The semiconductor devices may perform an auto-pre-charge operation after receiving or outputting data having one or more bits, the number of which is set according to a burst length, if the write operation or the read operation is performed.

SUMMARY

According to an embodiment, a semiconductor device includes an input/output (I/O) control signal generation circuit, a pipe circuit and an auto-pre-charge signal generation circuit. The I/O control signal generation circuit generates an input control signal, an output control signal and an internal output control signal based on a bank mode and a burst length. The pipe circuit latches an internal command/address signal based on the input control signal and outputs the latched internal command/address signal as a latch signal based on the output control signal and outputs the latched internal command/address signal as an internal latch signal based on the internal output control signal. The auto-pre-charge signal generation circuit generates an auto-pre-charge signal from the latch signal and the internal latch signal based on the bank mode and the burst length.

According to another embodiment, a semiconductor device includes an input/output (I/O) control signal generation circuit, a pipe circuit and an auto-pre-charge signal generation circuit. The I/O control signal generation circuit generates a write input control signal based on a write signal and generates a write output control signal and an internal write output control signal based on a write flag and an internal write flag. The pipe circuit is synchronized with the write input control signal to latch an internal command/address signal and is synchronized with the write output control signal to output the latched internal command/address signal as a write latch signal and configured to be synchronized with the internal write output control signal to output the latched internal command/address signal as an internal write latch signal. The auto-pre-charge signal generation circuit generates a write auto-pre-charge signal based on the internal write latch signal in a bank group mode, in which a column operation is executed before and after a bubble period and generates the write auto-pre-charge signal based on the write latch signal if the semiconductor device shifts to a different bank mode.

According to yet another embodiment, a semiconductor device includes an input/output (I/O) control signal generation circuit, a pipe circuit and an auto-pre-charge signal generation circuit. The I/O control signal generation circuit generates a read input control signal based on a read signal and generates a read output control signal and an internal read output control signal based on a read flag and an internal read flag. The pipe circuit is synchronized with the read input control signal to latch an internal command/address signal and is synchronized with the read output control signal to output the latched internal command/address signal as a read latch signal and configured to be synchronized with the internal read output control signal to output the latched internal command/address signal as an internal read latch signal. The auto-pre-charge signal generation circuit generates a read auto-pre-charge signal based on the internal read latch signal in a bank group mode, in which a column operation is executed before and after a bubble period and generates the read auto-pre-charge signal based on the read latch signal if the semiconductor device shifts to a different bank mode.

BRIEF DESCRIPTION OF THE DRAWINGS

FIG. 13 is a circuit diagram illustrating an example of a selection signal generation circuit included in the auto-pre-charge signal generation circuit of FIG. 12.

DETAILED DESCRIPTION OF THE EMBODIMENTS

Various embodiments of the present disclosure will be described hereinafter with reference to the accompanying drawings. However, the embodiments, described herein, are for illustrative purposes only and are not intended to limit the scope of the present disclosure.

Semiconductor devices including a plurality of banks may provide various bank modes such as a bank group mode, an 8-bank mode and a 16-bank mode. The plurality of banks may constitute a bank group. For example, four banks may constitute one bank group. In the bank group mode, a column operation for one bank included in the bank group may be performed by one command. In the 8-bank mode, column operations for two banks respectively included in two different bank groups may be sequentially performed by one command. In the 16-bank mode, column operations for four banks respectively included in four different bank groups may be sequentially performed by one command. In the bank group mode, column operations may be separately performed according to a burst length. For example, a column operation for 16-bit data may be performed at a time if the burst length is set to be '16' in the bank group mode. However, if the burst length is set to be '32' in the bank group mode, a first column operation for 16-bit data may be performed first and a second column operation, for the remaining 16-bit data, may be performed after a bubble period elapses, a time at which the first column operation terminates. The bubble period may be a duration of a column operation of another bank group. For example, when a read operation or a write operation is performed in the bank group mode while the burst length is set to be '32', the bubble period may be a length of time in which a column operation for a second 16-bit data is performed, after a column operation for a first 16-bit data is performed. The bubble period may be required only when the burst length is set to be '32' in the bank group mode. The bubble period may be set as a time period for performing a column operation for 16-bit data. During the bubble period, a column operation for another bank may also be performed. In such a case, a plurality of column operations for a plurality of banks may be sequentially performed using the bubble period.

Figure 1:
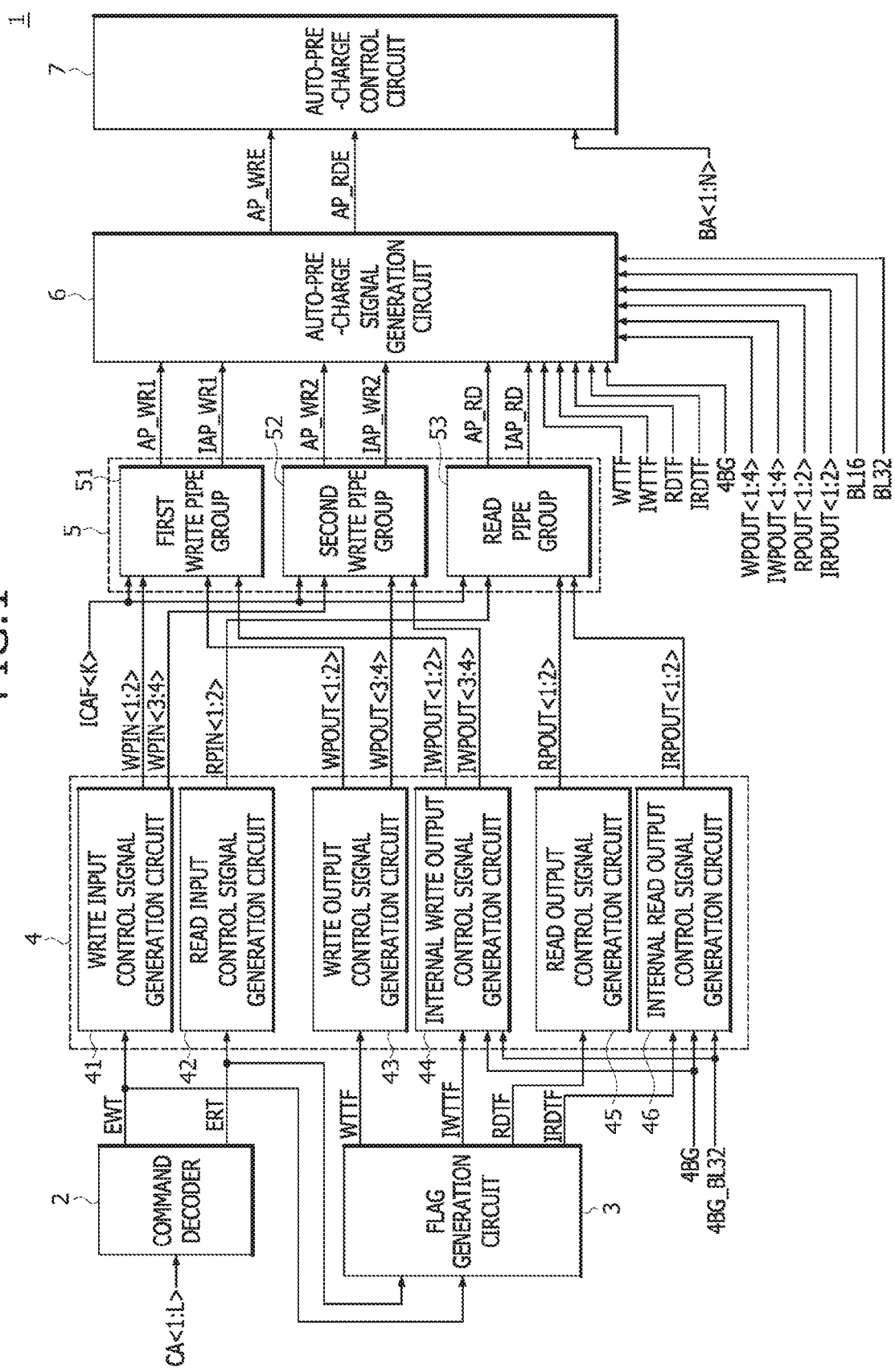
FIG. 1 is a block diagram illustrating a configuration of a semiconductor device according to an embodiment of the present disclosure.

As illustrated in FIG. 1, a semiconductor device 1 according to an embodiment may include a command decoder 2, a flag generation circuit 3, an input/output (I/O) control signal generation circuit 4, a pipe circuit 5, an auto-pre-charge signal generation circuit 6 and an auto-pre-charge control circuit 7.

The command decoder 2 may decode a command/address signal CA<1:L> to generate a write signal EWT and a read signal ERT. The write signal EWT may be generated to perform a write operation. The read signal ERT may be generated to perform a read operation. A logic level combination of the command/address signal CA<1:L> for generating the write signal EWT or the read signal ERT may be set to be different according to the embodiments.

The flag generation circuit 3 may generate a write flag WTTF and an internal write flag IWTTF in response to the write signal EWT. The flag generation circuit 3 may generate the write flag WTTF when a first write delay period elapses and after the write signal EWT is generated to perform the write operation. The flag generation circuit 3 may also generate the internal write flag IWTTF when a second write delay period elapses and after the write signal EWT is generated to perform the write operation. The first write delay period may be set by a write latency. The second write delay period may be set by the write latency and a burst length. The internal write flag IWTTF may be generated when a write flag delay period elapses after the write flag WTTF is generated. The write flag delay period for generating the internal write flag IWTTF may be set to be different according to the embodiments. For example, the write flag delay period may be set as a period that is required to receive 32-bit data in order to perform the write operation while the burst length is set to be '32' in the bank group mode.

The flag generation circuit 3 may generate a read flag RDTF and an internal read flag IRDTF in response to the read signal ERT. The flag generation circuit 3 may generate the read flag RDTF when a first read delay period elapses after the read signal ERT is generated to perform the read operation. The flag generation circuit 3 may also generate the internal read flag IRDTF when a second read delay period elapses after the read signal ERT is generated to perform the read operation. The first read delay period may be set to be different according to the embodiments. The flag generation circuit 3 may generate the read flag RDTF in synchronization with the read signal ERT. The internal read flag IRDTF may be generated after a read flag delay period elapses from a point of time that the read flag RDTF is generated. The read flag delay period for generating the internal read flag IRDTF may be set to be different according to the embodiments. For example, the read flag delay period may be set as a period that is required to receive 32-bit data in order to perform the read operation while the burst length is set to be '32' in the bank group mode.

The I/O control signal generation circuit 4 may generate first to fourth write input control signals WPIN<1:4>, first to fourth write output control signals WPOUT<1:4> and first to fourth internal write output control signals IWPOUT<1:4> based on the write signal EWT, the write flag WTTF and the internal write flag IWTTF. The I/O control signal generation circuit 4 may generate first and second read input control signals RPIN<1:2>, first and second read output control signals RPOUT<1:2> and first and second internal read output control signals IRPOUT<1:2> based on the read signal ERT, the read flag RDTF and the internal read flag IRDTF. The I/O control signal generation circuit 4 may include a write input control signal generation circuit 41, a read input control signal generation circuit 42, a write output control signal generation circuit 43, an internal write output control signal generation circuit 44, a read output control signal generation circuit 45 and an internal read output control signal generation circuit 46.

The write input control signal generation circuit 41 may sequentially and repeatedly generate the first to fourth write input control signals WPIN<1:4> whenever the write signal EWT is generated. For example, the write input control signal generation circuit 41 may generate the first write input control signal WPIN<1> if the write signal EWT is generated a first time, may generate the second write input control signal WPIN<2> if the write signal EWT is generated a second time, may generate the third write input control signal WPIN<3> if the write signal EWT is generated a third time, may generate the fourth write input control signal WPIN<4> if the write signal EWT is generated a fourth time, and may generate the first write input control signal WPIN<1> if the write signal EWT is generated a fifth time, and so on and so forth. A configuration and an operation of the write input control signal generation circuit 41 will be described more fully with reference to FIG. 2 later.

The read input control signal generation circuit 42 may alternately generate the first and second read input control signals RPIN<1:2> whenever the read signal ERT is generated. For example, the read input control signal generation circuit 42 may generate the first read input control signal RPIN<1> if the read signal ERT is generated a first time, may generate the second read input control signal RPIN<2> if the read signal ERT is generated a second time, and may generate the first read input control signal RPIN<1> if the read signal ERT is generated a third time, and so on and so forth. A configuration and an operation of the read input control signal generation circuit 42 will be described more fully with reference to FIG. 3 later.

The write output control signal generation circuit 43 may sequentially and repeatedly generate the first to fourth write output control signals WPOUT<1:4> whenever the write flag WTTF is generated. For example, the write output control signal generation circuit 43 may generate the first write output control signal WPOUT<1> if the write flag WTTF is generated a first time, may generate the second write output control signal WPOUT<2> if the write flag WTTF is generated a second time, may generate the third write output control signal WPOUT<3> if the write flag WTTF is generated a third time, may generate the fourth write output control signal WPOUT<4> if the write flag WTTF is generated a fourth time, and may generate the first write output control signal WPOUT<1> if the write flag WTTF is generated a fifth time, and so on and so forth. A configuration and an operation of the write output control signal generation circuit 43 will be described more fully with reference to FIG. 4 later.

The internal write output control signal generation circuit 44 may generate the first to fourth internal write output control signals IWPOUT<1:4> from the internal write flag IWTTF based on an operation mode signal 4BG and a burst operation mode signal 4BG_BL32. The operation mode signal 4BG may include information on whether the semiconductor device 1 enters the bank group mode. The burst operation mode signal 4BG_BL32 may include information on whether the write operation is performed with the burst length of '32' in the bank group mode. The internal write output control signal generation circuit 44 may sequentially and repeatedly generate the first to fourth internal write output control signals IWPOUT<1:4> whenever the internal write flag IWTTF is generated while the write operation is performed with the burst length of '32' in the bank group mode. For example, the internal write output control signal generation circuit 44 may generate the first internal write output control signal IWPOUT<1> if the internal write flag IWTTF is generated a first time, may generate the second internal write output control signal IWPOUT<2> if the internal write flag IWTTF is generated a second time, may generate the third internal write output control signal IWPOUT<3> if the internal write flag IWTTF is generated a third time, may generate the fourth internal write output control signal IWPOUT<4> if the internal write flag IWTTF is generated a fourth time, and may generate the first internal write output control signal IWPOUT<1> if the internal write flag IWTTF is generated a fifth time, and so on and so forth. A configuration and an operation of the internal write output control signal generation circuit 44 will be described more fully with reference to FIG. 5 later.

The read output control signal generation circuit 45 may alternately generate the first and second read output control signals RPOUT<1:2> whenever the read flag RDTF is generated. For example, the read output control signal generation circuit 45 may generate the first read output control signal RPOUT<1> if the read flag RDTF is generated a first time, may generate the second read output control signal RPOUT<2> if the read flag RDTF is generated a second time, and may generate the first read output control signal RPOUT<1> if the read flag RDTF is generated a third time, and so on and so forth. A configuration and an operation of the read output control signal generation circuit 45 will be described more fully with reference to FIG. 6 later.

The internal read output control signal generation circuit 46 may generate the first and second internal read output control signals IRPOUT<1:2> from the internal read flag IRDTF based on the operation mode signal 4BG and the burst operation mode signal 4BG_BL32. The internal read output control signal generation circuit 46 may alternately generate the first and second internal read output control signals IRPOUT<1:2> whenever the internal read flag IRDTF is generated while the read operation is performed with the burst length of '32' in the bank group mode. For example, the internal read output control signal generation circuit 46 may generate the first internal read output control signal IRPOUT<1> if the internal read flag IRDTF is generated a first time, may generate the second internal read output control signal IRPOUT<2> if the internal read flag IRDTF is generated a second time, and may generate the first internal read output control signal IRPOUT<1> if the internal read flag IRDTF is generated a third time, and so on and so forth. A configuration and an operation of the internal read output control signal generation circuit 46 will be described more fully with reference to FIG. 7 later.

The pipe circuit 5 may store an internal command/address signal ICAF<K> based on the first to fourth write input control signals WPIN<1:4> and may output the stored internal command/address signal ICAF<K> as one of a first write latch signal AP_WR1, a first internal write latch signal IAP_WR1, a second write latch signal AP_WR2 and a second internal write latch signal IAP_WR2 based on the first to fourth write output control signals WPOUT<1:4> and the first to fourth internal write output control signals IWPOUT<1:4>. The pipe circuit 5 may also store the internal command/address signal ICAF<K> based on the first and second read input control signals RPIN<1:2> and may output the stored internal command/address signal ICAF<K> as a read latch signal AP_RD or an internal read latch signal IAP_RD based on the first and second read output control signals RPOUT<1:2> or the first and second internal read output control signals IRPOUT<1:2>.

The pipe circuit 5 may include a first write pipe group 51, a second write pipe group 52 and a read pipe group 53.

The first write pipe group 51 may store the internal command/address signal ICAF<K> based on the first and second write input control signals WPIN<1:2>, and may output the stored internal command/address signal ICAF<K> as the first write latch signal AP_WR1 based on the first and second write output control signals WPOUT<1:2> or may output the stored internal command/address signal ICAF<K> as the first internal write latch signal IAP_WR1 based on the first and second internal write output control signals IWPOUT<1:2>. A configuration and an operation of the first write pipe group 51 will be described more fully with reference to FIGS. 8 and 9 later.

The second write pipe group 52 may store the internal command/address signal ICAF<K> based on the third and fourth write input control signals WPIN<3:4>, and may output the stored internal command/address signal ICAF<K> as the second write latch signal AP_WR2 based on the third and fourth write output control signals WPOUT<3:4> or may output the stored internal command/address signal ICAF<K> as the second internal write latch signal IAP_WR2 based on the third and fourth internal write output control signals IWPOUT<3:4>. A configuration and an operation of the second write pipe group 52 will be described more fully with reference to FIG. 10 later.

The read pipe group 53 may store the internal command/address signal ICAF<K> based on the first and second read input control signals RPIN<1:2>, and may output the stored internal command/address signal ICAF<K> as the read latch signal AP_RD based on the first and second read output control signals RPOUT<1:2> or may output the stored internal command/address signal ICAF<K> as the internal read latch signal IAP_RD based on the first and second internal read output control signals IRPOUT<1:2>. A configuration and an operation of the read pipe group 53 will be described more fully with reference to FIG. 11 later.

The auto-pre-charge signal generation circuit 6 may generate a write auto-pre-charge signal AP_WRE or a read auto-pre-charge signal AP_RDE from the first write latch signal AP_WR1, the first internal write latch signal IAP_WR1, the second write latch signal AP_WR2, the second internal write latch signal IAP_WR2, the read latch signal AP_RD and the internal read latch signal IAP_RD based on the write flag WTTF, the internal write flag IWTTF, the read flag RDTF, the internal read flag IRDTF, the operation mode signal 4BG, the first to fourth write output control signals WPOUT<1:4>, the first to fourth internal write output control signals IWPOUT<1:4>, the first and second read output control signals RPOUT<1:2>, the first and second internal read output control signals IRPOUT<1:2>, a first burst mode signal BL16 and a second burst mode signal BL32. A configuration and an operation of the auto-pre-charge signal generation circuit 6 will be described more fully with reference to FIGS. 12 to 15 later.

The auto-pre-charge control circuit 7 may perform an auto-pre-charge operation based on the write auto-pre-charge signal AP_WRE, the read auto-pre-charge signal AP_RDE and a bank address BA<1:N>. The auto-pre-charge control circuit 7 may perform the auto-pre-charge operation after the write operation of a cell array, selected by the bank address BA<1:N>, if the write auto-pre-charge signal AP_WRE is generated. The auto-pre-charge control circuit 7 may perform the auto-pre-charge operation after the read operation of a cell array, selected by the bank address BA<1:N>, if the read auto-pre-charge signal AP_RDE is generated.

Figure 2:
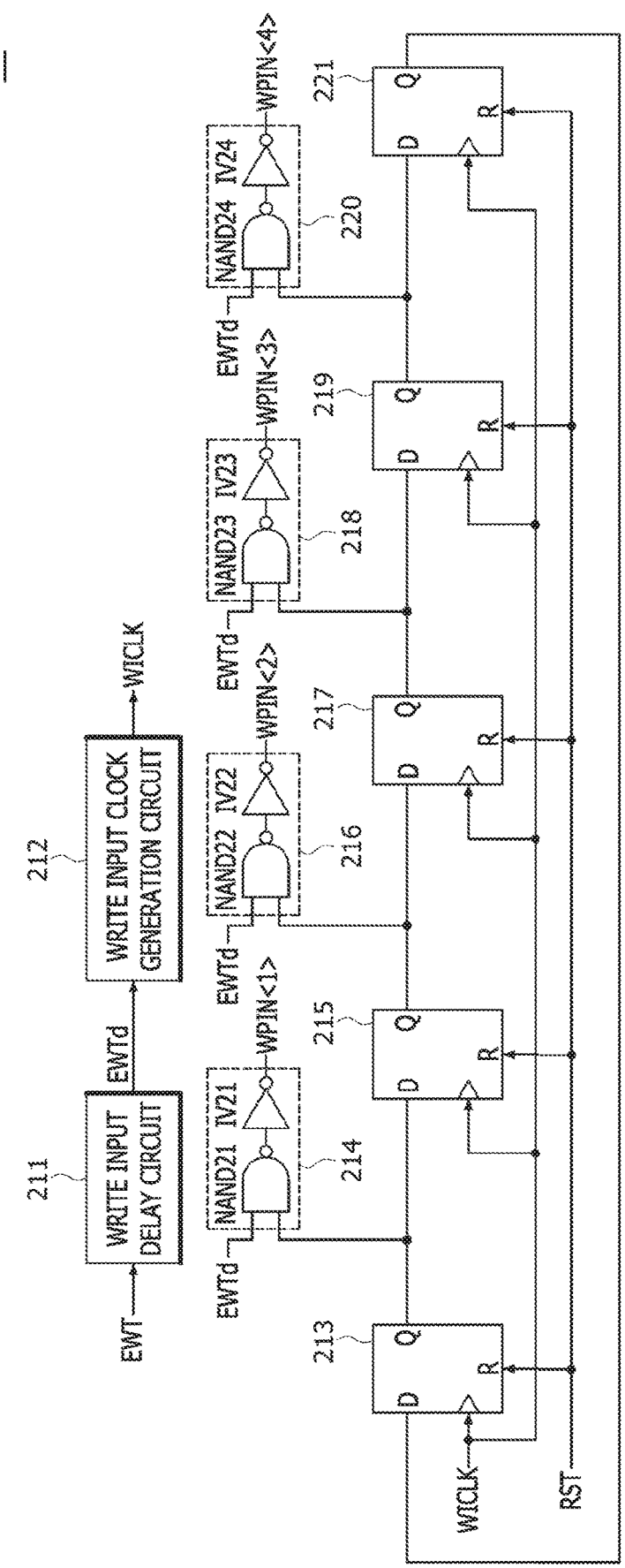
FIG. 2 is a circuit diagram illustrating an example of a write input control signal generation circuit included in the semiconductor device of FIG. 1.

Referring to FIG. 2, the write input control signal generation circuit 41 may include a write input delay circuit 211, a write input clock generation circuit 212, a first write input latch 213, a first write input control signal output circuit 214, a second write input latch 215, a second write input control signal output circuit 216, a third write input latch 217, a third write input control signal output circuit 218, a fourth write input latch 219, a fourth write input control signal output circuit 220 and a fifth write input latch 221.

The write input delay circuit 211 may delay the write signal EWT to generate a delayed write signal EWTd. The write input clock generation circuit 212 may generate a write input clock signal WICLK from the delayed write signal EWTd. The write input clock generation circuit 212 may delay the delayed write signal EWTd to generate the write input clock signal WICLK. A delay time of the write input delay circuit 211 for delaying the write signal EWT and a delay time of the write input clock generation circuit 212 for delaying the delayed write signal EWTd may be set to be different according to the embodiments. The write input clock signal WICLK may be generated after delay times of the write input delay circuit 211 and the write input clock generation circuit 212 elapse from a point of time that the write signal EWT is generated.

The first write input latch 213 may be realized using a D-flip flop having an output terminal Q which is initialized to have a logic "high" level if a reset signal RST is generated. The reset signal RST may be generated to include a pulse having a logic "high" level to perform an initialization operation. The first write input latch 213 may latch a signal inputted through an input terminal D, thereof, to output the latched signal through the output terminal Q in synchronization with the write input clock signal WICLK if the first write input control signal WPIN<1> is generated to have a logic "high" level by the write input clock signal WICLK, which is generated a first time after the initialization operation.

The first write input control signal output circuit 214 may be configured to perform a NAND operation and an inversion operation. For example, the first write input control signal output circuit 214 may include a NAND gate NAND21 and an inverter IV21 and may perform a logical AND operation based on the delayed write signal EWTd and a signal of the output terminal Q of the first write input latch 213 to generate the first write input control signal WPIN<1>. The first write input control signal output circuit 214 may generate the first write input control signal WPIN<1> having a logic "high" level if the write input clock signal WICLK is generated a first time after the initialization operation and the delayed write signal EWTd is generated to have a logic "high" level.

The second write input latch 215 may be realized using a D-flip flop having an output terminal Q which is initialized to have a logic "low" level if the reset signal RST is generated. The second write input latch 215 may latch a signal inputted through an input terminal D, thereof, to output the latched signal through the output terminal Q in synchronization with the write input clock signal WICLK if the second write input control signal WPIN<2> is generated to have a logic "high" level by the write input clock signal WICLK generated at a second time after the initialization operation.

The second write input control signal output circuit 216 may be configured to perform a NAND operation and an inversion operation. For example, the first write input control signal output circuit 216 may include a NAND gate NAND22 and an inverter IV22 and may perform a logical AND operation based on the delayed write signal EWTd and a signal of the output terminal Q of the second write input latch 215 to generate the second write input control signal WPIN<2>. The second write input control signal output circuit 216 may generate the second write input control signal WPIN<2> having a logic "high" level if the write input clock signal WICLK is generated a second time after the initialization operation and the delayed write signal EWTd is generated to have a logic "high" level.

The third write input latch 217 may be realized using a D-flip flop having an output terminal Q which is initialized to have a logic "low" level if the reset signal RST is generated. The third write input latch 217 may latch a signal inputted through an input terminal D, thereof, to output the latched signal through the output terminal Q in synchronization with the write input clock signal WICLK if the third write input control signal WPIN<3> is generated to have a logic "high" level by the write input clock signal WICLK generated a third time after the initialization operation.

The third write input control signal output circuit 218 may be configured to perform a NAND operation and an inversion operation. For example, the first write input control signal output circuit 218 may include a NAND gate NAND23 and an inverter IV23 and may perform a logical AND operation of the delayed write signal EWTd and a signal of the output terminal Q of the third write input latch 217 to generate the third write input control signal WPIN<3>. The third write input control signal output circuit 218 may generate the third write input control signal WPIN<3> having a logic "high" level if the write input clock signal WICLK is generated a third time after the initialization operation and the delayed write signal EWTd is generated to have a logic "high" level.

The fourth write input latch 219 may be realized using a D-flip flop having an output terminal Q which is initialized to have a logic "low" level if the reset signal RST is generated. The fourth write input latch 219 may latch a signal inputted through an input terminal D, thereof, to output the latched signal through the output terminal Q in synchronization with the write input clock signal WICLK if the fourth write input control signal WPIN<4> is generated to have a logic "high" level by the write input clock signal WICLK generated a fourth time after the initialization operation.

The fourth write input control signal output circuit 220 may be configured to perform a NAND operation and an inversion operation. For example, the first write input control signal output circuit 220 may include a NAND gate NAND24 and an inverter IV24 and may perform a logical AND operation of the delayed write signal EWTd and a signal of the output terminal Q of the fourth write input latch 219 to generate the fourth write input control signal WPIN<4>. The fourth write input control signal output circuit 220 may generate the fourth write input control signal WPIN<4> having a logic "high" level if the write input clock signal WICLK is generated a fourth time after the initialization operation and the delayed write signal EWTd is generated to have a logic "high" level.

The fifth write input latch 221 may be realized using a D-flip flop having an output terminal Q which is initialized to have a logic "low" level if the reset signal RST is generated. A signal of the output terminal Q of the fifth write input latch 221 may be fed back to the input terminal D of the first write input latch 213.

The write input control signal generation circuit 41 may sequentially and repeatedly generate the first to fourth write input control signals WPIN<1:4> whenever the write signal EWT is generated. The write input control signal generation circuit 41 may generate the first write input control signal WPIN<1> if the write signal EWT is generated a first time, may generate the second write input control signal WPIN<2> if the write signal EWT is generated a second time, may generate the third write input control signal WPIN<3> if the write signal EWT is generated a third time, may generate the fourth write input control signal WPIN<4> if the write signal EWT is generated a fourth time, and may generate the first write input control signal WPIN<1> if the write signal EWT is generated a fifth time, and so on and so forth.

Figure 3:
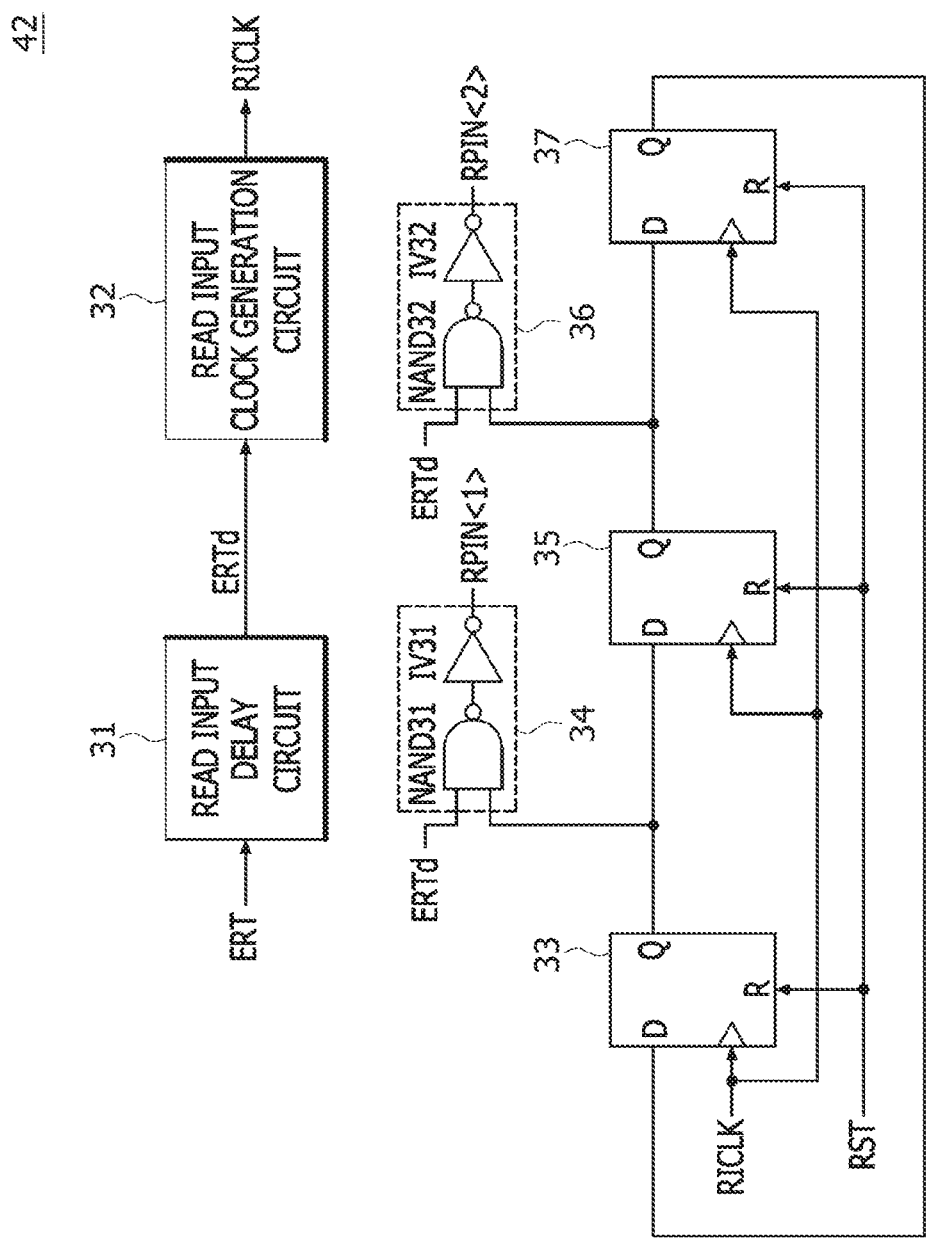
FIG. 3 illustrates an example of a read input control signal generation circuit included in the semiconductor device of FIG. 1.

Referring to FIG. 3, the read input control signal generation circuit 42 may include a read input delay circuit 31, a read input clock generation circuit 32, a first read input latch 33, a first read input control signal output circuit 34, a second read input latch 35, a second read input control signal output circuit 36 and a third read input latch 37.

The read input delay circuit 31 may delay the read signal ERT to generate a delayed read signal ERTd. The read input clock generation circuit 32 may generate a read input clock signal RICLK from the delayed read signal ERTd. The read input clock generation circuit 32 may delay the delayed read signal ERTd to generate the read input clock signal RICLK. A delay time of the read input delay circuit 31 for delaying the read signal ERT and a delay time of the read input clock generation circuit 32 for delaying the delayed read signal ERTd may be set to be different according to the embodiments. The read input clock signal RICLK may be generated after delay times of the read input delay circuit 31 and the read input clock generation circuit 32 elapse from a point of time that the read signal ERT is generated.

The first read input latch 33 may be realized using a D-flip flop having an output terminal Q which is initialized to have a logic "high" level if the reset signal RST is generated. The first read input latch 33 may latch a signal inputted through an input terminal D, thereof, to output the latched signal through the output terminal Q in synchronization with the read input clock signal RICLK if the first read input control signal RPIN<1> is generated to have a logic "high" level by the read input clock signal RICLK generated a first time after the initialization operation.

The first read input control signal output circuit 34 may be configured to perform a NAND operation and an inversion operation. For example, the first read input control signal output circuit 34 may include a NAND gate NAND31 and an inverter IV31 and may perform a logical AND operation based on the delayed read signal ERTd and a signal of the output terminal Q of the first read input latch 33 to generate the first read input control signal RPIN<1>. The first read input control signal output circuit 34 may generate the first read input control signal RPIN<1> having a logic "high" level if the read input clock signal RICLK is generated a first time after the initialization operation and the delayed read signal ERTd is generated to have a logic "high" level.

The second read input latch 35 may be realized using a D-flip flop having an output terminal Q which is initialized to have a logic "low" level if the reset signal RST is generated. The second read input latch 35 may latch a signal inputted through an input terminal D, thereof, to output the latched signal through the output terminal Q in synchronization with the read input clock signal RICLK if the second read input control signal RPIN<2> is generated to have a logic "high" level by the read input clock signal RICLK generated a second time after the initialization operation.

The second read input control signal output circuit 36 may be configured to perform a NAND operation and an inversion operation. For example, the first read input control signal output circuit 36 may include a NAND gate NAND32 and an inverter IV32 and may perform a logical AND operation based on the delayed read signal ERTd and a signal of the output terminal Q of the second read input latch 35 to generate the second read input control signal RPIN<2>. The second read input control signal output circuit 36 may generate the second read input control signal RPIN<2> having a logic "high" level if the read input clock signal RICLK is generated a second time after the initialization operation and the delayed read signal ERTd is generated to have a logic "high" level.

The third read input latch 37 may be realized using a D-flip flop having an output terminal Q which is initialized to have a logic "low" level if the reset signal RST is generated. A signal of the output terminal Q of the third read input latch 37 may be fed back to the input terminal D of the first read input latch 33.

The read input control signal generation circuit 42 may alternately generate the first and second read input control signals RPIN<1:2> whenever the read signal ERT is generated. The read input control signal generation circuit 42 may generate the first read input control signal RPIN<1> if the read signal ERT is generated a first time, may generate the second read input control signal RPIN<2> if the read signal ERT is generated a second time, and may generate the first read input control signal RPIN<1> if the read signal ERT is generated a third time, and so on and so forth.

Figure 4:
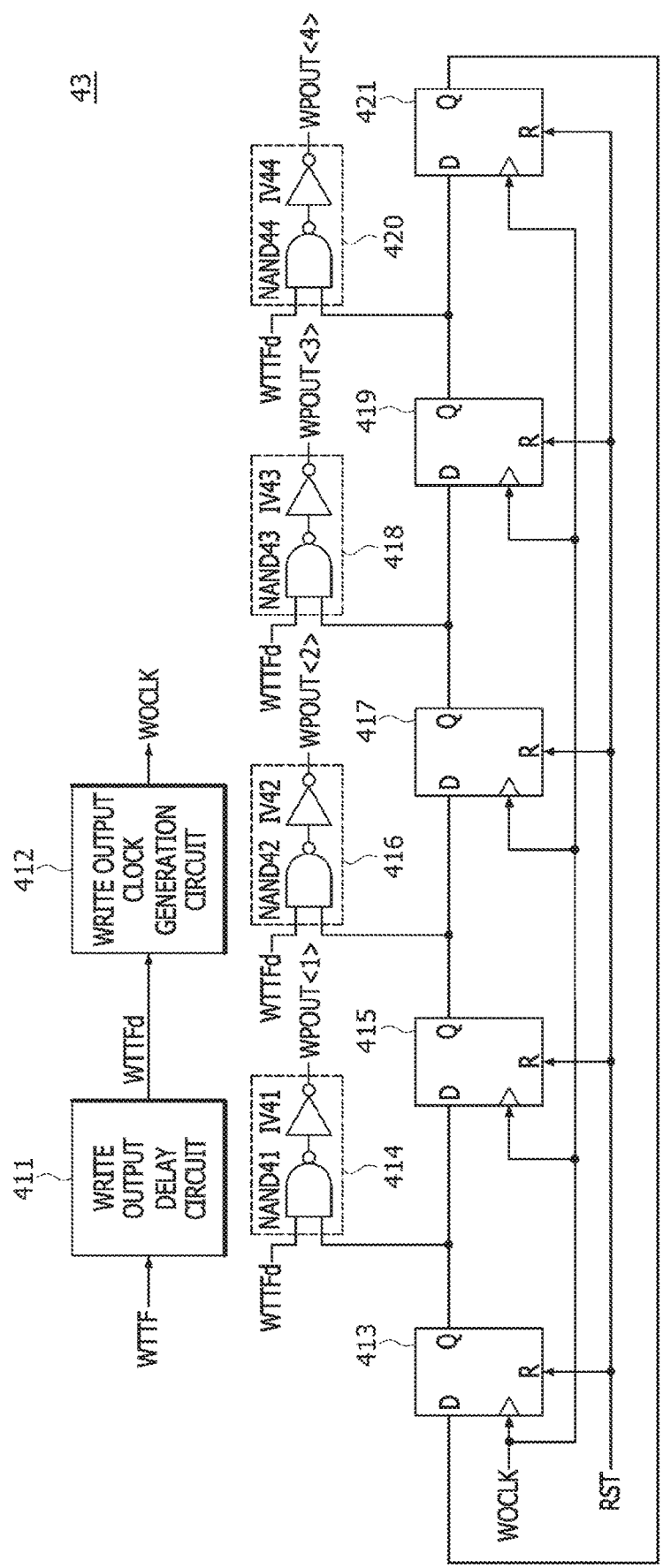
FIG. 4 illustrates an example of a write output control signal generation circuit included in the semiconductor device of FIG. 1.

Referring to FIG. 4, the write output control signal generation circuit 43 may include a write output delay circuit 411, a write output clock generation circuit 412, a first write output latch 413, a first write output control signal output circuit 414, a second write output latch 415, a second write output control signal output circuit 416, a third write output latch 417, a third write output control signal output circuit 418, a fourth write output latch 419, a fourth write output control signal output circuit 420 and a fifth write output latch 421.

The write output delay circuit 411 may delay the write flag WTTF to generate a delayed write flag WTTFd. The write output clock generation circuit 412 may generate a write output clock signal WOCLK from the delayed write flag WTTFd. The write output clock generation circuit 412 may delay the delayed write flag WTTFd to generate the write output clock signal WOCLK. A delay time of the write output delay circuit 411 for delaying the write flag WTTF and a delay time of the write output clock generation circuit 412 for delaying the delayed write flag WTTFd may be set to be different according to the embodiments. The write output clock signal WOCLK may be generated after delay times of the write output delay circuit 411 and the write output clock generation circuit 412 elapse from a point of time that the write flag WTTF is generated.

The first write output latch 413 may be realized using a D-flip flop having an output terminal Q which is initialized to have a logic "high" level if the reset signal RST is generated. The first write output latch 413 may latch a signal inputted through an input terminal D, thereof, to output the latched signal through the output terminal Q in synchronization with the write output clock signal WOCLK if the first write output control signal WPOUT<1> is generated to have a logic "high" level by the write output clock signal WOCLK generated a first time after the initialization operation.

The first write output control signal output circuit 414 may be configured to perform a NAND operation and an inversion operation. For example, the first write output control signal output circuit 414 may include a NAND gate NAND41 and an inverter IV41 and may perform a logical AND operation based on the delayed write flag WTTFd and a signal of the output terminal Q of the first write output latch 413 to generate the first write output control signal WPOUT<1>. The first write output control signal output circuit 414 may generate the first write output control signal WPOUT<1> having a logic "high" level if the write output clock signal WOCLK is generated a first time after the initialization operation and the delayed write flag WTTFd is generated to have a logic "high" level.

The second write output latch 415 may be realized using a D-flip flop having an output terminal Q which is initialized to have a logic "low" level if the reset signal RST is generated. The second write output latch 415 may latch a signal inputted through an input terminal D, thereof, to output the latched signal through the output terminal Q in synchronization with the write output clock signal WOCLK if the second write output control signal WPOUT<2> is generated to have a logic "high" level by the write output clock signal WOCLK generated a second time after the initialization operation.

The second write output control signal output circuit 416 may be configured to perform a NAND operation and an inversion operation. For example, the second write output control signal output circuit 416 may include a NAND gate NAND42 and an inverter IV42 and may perform a logical AND operation based on the delayed write flag WTTFd and a signal of the output terminal Q of the second write output latch 415 to generate the second write output control signal WPOUT<2>. The second write output control signal output circuit 416 may generate the second write output control signal WPOUT<2> having a logic "high" level if the write output clock signal WOCLK is generated a second time after the initialization operation and the delayed write flag WTTFd is generated to have a logic "high" level.

The third write output latch 417 may be realized using a D-flip flop having an output terminal Q which is initialized to have a logic "low" level if the reset signal RST is generated. The third write output latch 417 may latch a signal inputted through an input terminal D, thereof, to output the latched signal through the output terminal Q in synchronization with the write output clock signal WOCLK if the third write output control signal WPOUT<3> is generated to have a logic "high" level by the write output clock signal WOCLK generated a third time after the initialization operation.

The third write output control signal output circuit 418 may be configured to perform a NAND operation and an inversion operation. For example, the third write output control signal output circuit 418 may include a NAND gate NAND43 and an inverter IV43 and may perform a logical AND operation based on the delayed write flag WTTFd and a signal of the output terminal Q of the third write output latch 417 to generate the third write output control signal WPOUT<3>. The third write output control signal output circuit 418 may generate the third write output control signal WPOUT<3> having a logic "high" level if the write output clock signal WOCLK is generated a third time after the initialization operation and the delayed write flag WTTFd is generated to have a logic "high" level.

The fourth write output latch 419 may be realized using a D-flip flop having an output terminal Q which is initialized to have a logic "low" level if the reset signal RST is generated. The fourth write output latch 419 may latch a signal inputted through an input terminal D, thereof, to output the latched signal through the output terminal Q in synchronization with the write output clock signal WOCLK if the fourth write output control signal WPOUT<4> is generated to have a logic "high" level by the write output clock signal WOCLK generated a fourth time after the initialization operation.

The fourth write output control signal output circuit 420 may be configured to perform a NAND operation and an inversion operation. For example, the fourth write output control signal output circuit 420 may include a NAND gate NAND44 and an inverter IV44 and may perform a logical AND operation based on the delayed write flag WTTFd and a signal of the output terminal Q of the fourth write output latch 419 to generate the fourth write output control signal WPOUT<4>. The fourth write output control signal output circuit 420 may generate the fourth write output control signal WPOUT<4> having a logic "high" level if the write output clock signal WOCLK is generated a fourth time after the initialization operation and the delayed write flag WTTFd is generated to have a logic "high" level.

The fifth write output latch 421 may be realized using a D-flip flop having an output terminal Q which is initialized to have a logic "low" level if the reset signal RST is generated. A signal of the output terminal Q of the fifth write output latch 421 may be fed back to the input terminal D of the first write output latch 413.

The write output control signal generation circuit 43 may sequentially and repeatedly generate the first to fourth write output control signals WPOUT<1:4> whenever the write flag WTTF is generated. The write output control signal generation circuit 43 may generate the first write output control signal WPOUT<1> if the write flag WTTF is generated a first time, may generate the second write output control signal WPOUT<2> if the write flag WTTF is generated a second time, may generate the third write output control signal WPOUT<3> if the write flag WTTF is generated a third time, may generate the fourth write output control signal WPOUT<4> if the write flag WTTF is generated a fourth time, and may generate the first write output control signal WPOUT<1> if the write flag WTTF is generated a fifth time, and so on and so forth.

Figure 5:
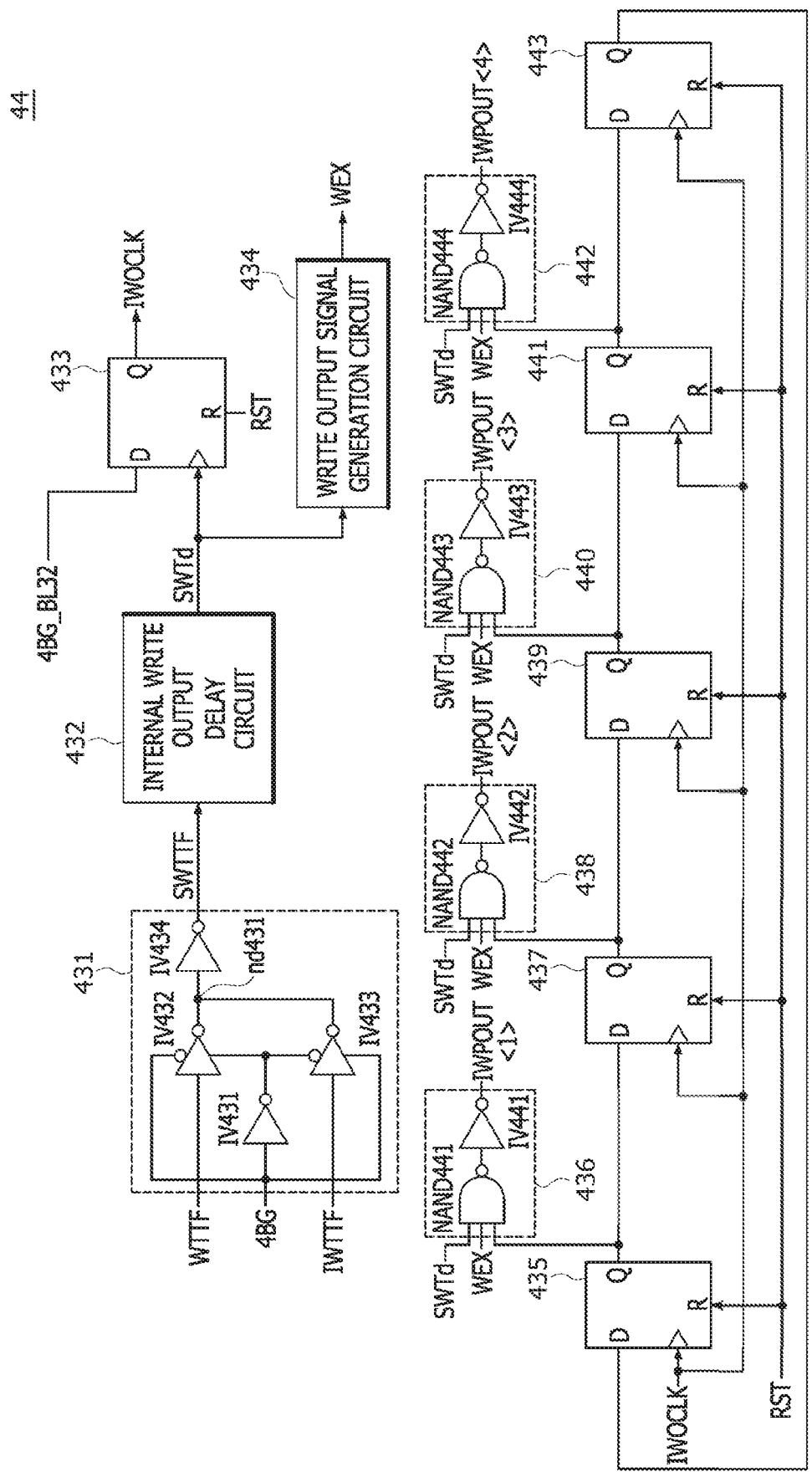
FIG. 5 illustrates an example of an internal write output control signal generation circuit included in the semiconductor device of FIG. 1.

Referring to FIG. 5, the internal write output control signal generation circuit 44 may include a selection write flag generation circuit 431, an internal write output delay circuit 432, an internal write output clock generation circuit 433, a write output signal generation circuit 434, a first internal write output latch 435, a first internal write output control signal output circuit 436, a second internal write output latch 437, a second internal write output control signal output circuit 438, a third internal write output latch 439, a third internal write output control signal output circuit 440, a fourth internal write output latch 441, a fourth internal write output control signal output circuit 442 and a fifth internal write output latch 443.

The selection write flag generation circuit 431 may be configured to perform inversion operations. For example, the selection write flag generation circuit 431 may include inverters IV431~IV434. The inverter IV431 may inversely buffer the operation mode signal 4BG to output the inversely buffered signal of the operation mode signal 4BG. The operation mode signal 4BG may be set to have a logic "high" level in the bank group mode. The inverter IV432 may inversely buffer the write flag WTTF to output the inversely buffered signal of the write flag WTTF to a node nd431 in a non-bank group mode. The inverter IV433 may inversely buffer the internal write flag IWTTF to output the inversely buffered signal of the internal write flag IWTTF to the node nd431 in the bank group mode. The inverter IV434 may inversely buffer a signal of the node nd431 to output the inversely buffered signal of the signal of the node nd431 as a selection write flag SWTTF.

The internal write output delay circuit 432 may delay the selection write flag SWTTF to generate a delayed selection write flag SWTd. The internal write output clock generation circuit 433 may be realized using a D-flip flop which is capable of generating an internal write output clock signal IWOCLK from the burst operation mode signal 4BG_BL32 in synchronization with the delayed selection write flag SWTd. The internal write output clock generation circuit 433 may initialize the internal write output clock signal IWOCLK to a logic "low" level if the reset signal RST is generated. The burst operation mode signal 4BG_BL32 may be set to have a logic "high" level if the write operation is performed while the burst length is set to be '32' in the bank group mode. The write output signal generation circuit 434 may generate a write output signal WEX if the delayed selection write flag SWTd is generated. The write output signal generation circuit 434 may delay the delayed selection write flag SWTd to generate the write output signal WEX.

The first internal write output latch 435 may be realized using a D-flip flop having an output terminal Q which is initialized to have a logic "high" level if the reset signal RST is generated. The first internal write output latch 435 may latch a signal inputted through an input terminal D, thereof, to output the latched signal through the output terminal Q in synchronization with the internal write output clock signal IWOCLK if the first internal write output control signal IWPOUT<1> is generated to have a logic "high" level by the internal write output clock signal IWOCLK generated a first time after the initialization operation.

The first internal write output control signal output circuit 436 may be configured to perform a NAND operation and an inversion operation. For example, the first internal write output control signal output circuit 436 may include a NAND gate NAND441 and an inverter IV441 and may perform a logical AND operation based on the delayed selection write flag SWTd, the write output signal WEX and a signal of the output terminal Q of the first internal write output latch 435 to generate the first internal write output control signal IWPOUT<1>. The first internal write output control signal output circuit 436 may generate the first internal write output control signal IWPOUT<1> having a logic "high" level if the internal write output clock signal IWOCLK is generated a first time after the initialization operation and both of the delayed selection write flag SWTd and the write output signal WEX are generated to have a logic "high" level.

The second internal write output latch 437 may be realized using a D-flip flop having an output terminal Q which is initialized to have a logic "low" level if the reset signal RST is generated. The second internal write output latch 437 may latch a signal inputted through an input terminal D, thereof, to output the latched signal through the output terminal Q in synchronization with the internal write output clock signal IWOCLK if the second internal write output control signal IWPOUT<2> is generated to have a logic "high" level by the internal write output clock signal IWOCLK generated a second time after the initialization operation.

The second internal write output control signal output circuit 438 may be configured to perform a NAND operation and an inversion operation. For example, the second internal write output control signal output circuit 438 may include a NAND gate NAND442 and an inverter IV442 and may perform a logical AND operation based on the delayed selection write flag SWTd, the write output signal WEX and a signal of the output terminal Q of the second internal write output latch 437 to generate the second internal write output control signal IWPOUT<2>. The second internal write output control signal output circuit 438 may generate the second internal write output control signal IWPOUT<2> having a logic "high" level if the internal write output clock signal IWOCLK is generated a second time after the initialization operation and both of the delayed selection write flag SWTd and the write output signal WEX are generated to have a logic "high" level.

The third internal write output latch 439 may be realized using a D-flip flop having an output terminal Q which is initialized to have a logic "low" level if the reset signal RST is generated. The third internal write output latch 439 may latch a signal inputted through an input terminal D, thereof, to output the latched signal through the output terminal Q in synchronization with the internal write output clock signal IWOCLK if the third internal write output control signal IWPOUT<3> is generated to have a logic "high" level by the internal write output clock signal IWOCLK generated a third time after the initialization operation.

The third internal write output control signal output circuit 440 may be configured to perform a NAND operation and an inversion operation. For example, the third internal write output control signal output circuit 440 may include a NAND gate NAND443 and an inverter IV443 and may perform a logical AND operation based on the delayed selection write flag SWTd, the write output signal WEX and a signal of the output terminal Q of the third internal write output latch 439 to generate the third internal write output control signal IWPOUT<3>. The third internal write output control signal output circuit 440 may generate the third internal write output control signal IWPOUT<3> having a logic "high" level if the internal write output clock signal IWOCLK is generated a third time after the initialization operation and both of the delayed selection write flag SWTd and the write output signal WEX are generated to have a logic "high" level.

The fourth internal write output latch 441 may be realized using a D-flip flop having an output terminal Q which is initialized to have a logic "low" level if the reset signal RST is generated. The fourth internal write output latch 441 may latch a signal inputted through an input terminal D, thereof, to output the latched signal through the output terminal Q in synchronization with the internal write output clock signal IWOCLK if the fourth internal write output control signal IWPOUT<4> is generated to have a logic "high" level by the internal write output clock signal IWOCLK generated a fourth time after the initialization operation.

The fourth internal write output control signal output circuit 442 may be configured to perform a NAND operation and an inversion operation. For example, the fourth internal write output control signal output circuit 442 may include a NAND gate NAND444 and an inverter IV444 and may perform a logical AND operation based on the delayed selection write flag SWTd, the write output signal WEX and a signal of the output terminal Q of the fourth internal write output latch 441 to generate the fourth internal write output control signal IWPOUT<4>. The fourth internal write output control signal output circuit 442 may generate the fourth internal write output control signal IWPOUT<4> having a logic "high" level if the internal write output clock signal IWOCLK is generated a fourth time after the initialization operation and both of the delayed selection write flag SWTd and the write output signal WEX are generated to have a logic "high" level.

The fifth internal write output latch 443 may be realized using a D-flip flop having an output terminal Q which is initialized to have a logic "low" level if the reset signal RST is generated. A signal of the output terminal Q of the fifth internal write output latch 443 may be fed back to the input terminal D of the first internal write output latch 435.

The internal write output control signal generation circuit 44 may sequentially and repeatedly generate the first to fourth internal write output control signals IWPOUT<1:4> whenever the internal write flag IWTTF is generated for the write operation performed while the burst length is set to be '32' in the bank group mode. For example, the internal write output control signal generation circuit 44 may generate the first internal write output control signal IWPOUT<1> if the internal write flag IWTTF is generated a first time, may generate the second internal write output control signal IWPOUT<2> if the internal write flag IWTTF is generated a second time, may generate the third internal write output control signal IWPOUT<3> if the internal write flag IWTTF is generated a third time, may generate the fourth internal write output control signal IWPOUT<4> if the internal write flag IWTTF is generated a fourth time, and may generate the first internal write output control signal IWPOUT<1> if the internal write flag IWTTF is generated a fifth time, and so on and so forth.

Figure 6:
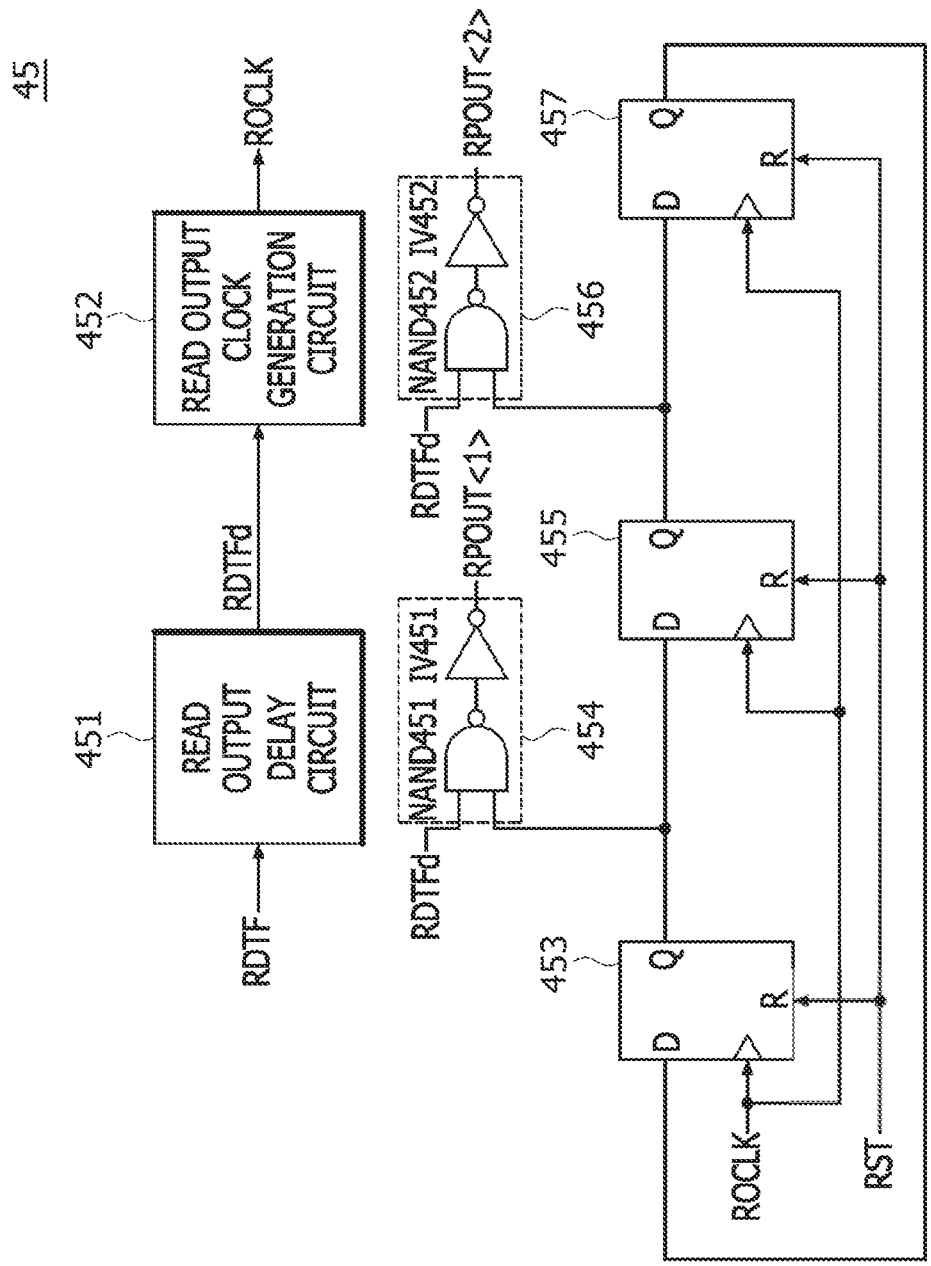
FIG. 6 illustrates an example of a read output control signal generation circuit included in the semiconductor device of FIG. 1.

Referring to FIG. 6, the read output control signal generation circuit 45 may include a read output delay circuit 451, a read output clock generation circuit 452, a first read output latch 453, a first read output control signal output circuit 454, a second read output latch 455, a second read output control signal output circuit 456 and a third read output latch 457.

The read output delay circuit 451 may delay the read flag RDTF to generate a delayed read flag RDTFd. The read output clock generation circuit 452 may generate a read output clock signal ROCLK from the delayed read flag RDTFd. The read output clock generation circuit 452 may delay the delayed read flag RDTFd to generate the read output clock signal ROCLK. A delay time of the read output delay circuit 451 for delaying the read flag RDTF and a delay time of the read output clock generation circuit 452 for delaying the delayed read flag RDTFd may be set to be different according to the embodiments. The read output clock signal ROCLK may be generated after delay times of the read output delay circuit 451 and the read output clock generation circuit 452 elapse from a point of time that the read flag RDTF is generated.

The first read output latch 453 may be realized using a D-flip flop having an output terminal Q which is initialized to have a logic "high" level if the reset signal RST is generated. The first read output latch 453 may latch a signal inputted through an input terminal D, thereof, to output the latched signal through the output terminal Q in synchronization with the read output clock signal ROCLK if the first read output control signal RPOUT<1> is generated to have a logic "high" level by the read output clock signal ROCLK generated a first time after the initialization operation.

The first read output control signal output circuit 454 may be configured to perform a NAND operation and an inversion operation. For example, the first read output control signal output circuit 454 may include a NAND gate NAND451 and an inverter IV451 and may perform a logical AND operation based on the delayed read flag RDTFd and a signal of the output terminal Q of the first read output latch 453 to generate the first read output control signal RPOUT<1>. The first read output control signal output circuit 454 may generate the first read output control signal RPOUT<1> having a logic "high" level if the read output clock signal ROCLK is generated a first time after the initialization operation and the delayed read flag RDTFd is generated to have a logic "high" level.

The second read output latch 455 may be realized using a D-flip flop having an output terminal Q which is initialized to have a logic "low" level if the reset signal RST is generated. The second read output latch 455 may latch a signal inputted through an input terminal D, thereof, to output the latched signal through the output terminal Q in synchronization with the read output clock signal ROCLK if the second read output control signal RPOUT<2> is generated to have a logic "high" level by the read output clock signal ROCLK generated a second time after the initialization operation.

The second read output control signal output circuit 456 may be configured to perform a NAND operation and an inversion operation. For example, the second read output control signal output circuit 456 may include a NAND gate NAND452 and an inverter IV452 and may perform a logical AND operation based on the delayed read flag RDTFd and a signal of the output terminal Q of the second read output latch 455 to generate the second read output control signal RPOUT<2>. The second read output control signal output circuit 456 may generate the second read output control signal RPOUT<2> having a logic "high" level if the read output clock signal ROCLK is generated a second time after the initialization operation and the delayed read flag RDTFd is generated to have a logic "high" level.

The third read output latch 457 may be realized using a D-flip flop having an output terminal Q which is initialized to have a logic "low" level if the reset signal RST is generated. A signal of the output terminal Q of the third read output latch 457 may be fed back to the input terminal D of the first read output latch 453.

The read output control signal generation circuit 45 may alternately generate the first and second read output control signals RPOUT<1:2> whenever the read flag RDTF is generated. The read output control signal generation circuit 45 may generate the first read output control signal RPOUT<1> if the read flag RDTF is generated a first time, may generate the second read output control signal RPOUT<2> if the read flag RDTF is generated a second time, and may generate the first read output control signal RPOUT<1> if the read flag RDTF is generated a third time, and so on and so forth.

Figure 7:
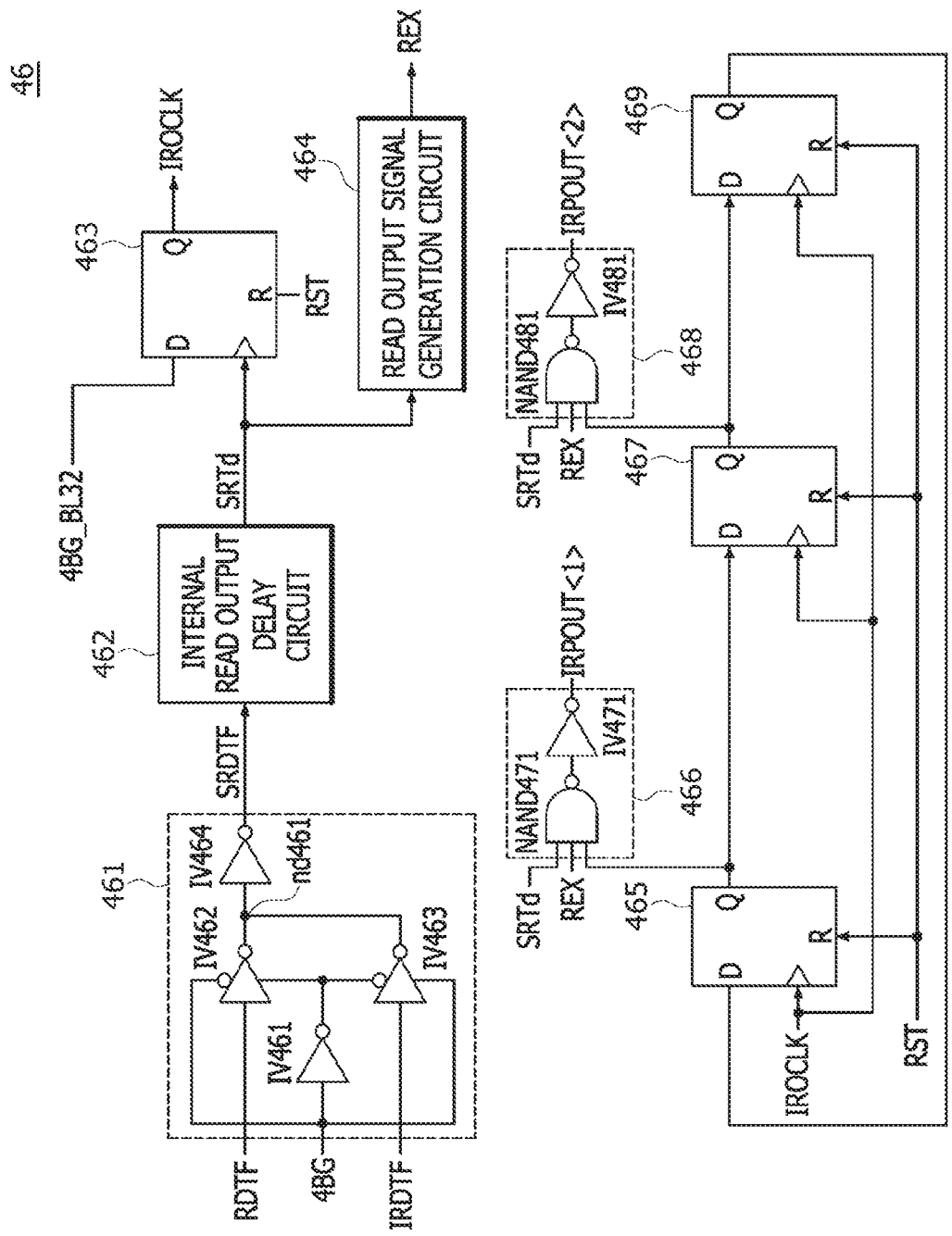
FIG. 7 illustrates an example of an internal read output control signal generation circuit included in the semiconductor device of FIG. 1.

Referring to FIG. 7, the internal read output control signal generation circuit 46 may include a selection read flag generation circuit 461, an internal read output delay circuit 462, an internal read output clock generation circuit 463, a read output signal generation circuit 464, a first internal read output latch 465, a first internal read output control signal output circuit 466, a second internal read output latch 467, a second internal read output control signal output circuit 468 and a third internal read output latch 469.

The selection read flag generation circuit 461 may be configured to perform inversion operations. For example, the selection read flag generation circuit 461 may include inverters IV461~IV464. The inverter IV461 may inversely buffer the operation mode signal 4BG to output the inversely buffered signal of the operation mode signal 4BG. The inverter IV462 may inversely buffer the read flag RDTF to output the inversely buffered signal of the read flag RDTF to a node nd461 in the non-bank group mode. The inverter IV463 may inversely buffer the internal read flag IRDTF to output the inversely buffered signal of the internal read flag IRDTF to the node nd461 in the bank group mode. The inverter IV464 may inversely buffer a signal of the node nd461 to output the inversely buffered signal of the signal of the node nd461 as a selection read flag SRDTF.

The internal read output delay circuit 462 may delay the selection read flag SRDTF to generate a delayed selection read flag SRTd. The internal read output clock generation circuit 463 may be realized using a D-flip flop which is capable of generating an internal read output clock signal IROCLK from the burst operation mode signal 4BG_BL32 in synchronization with the delayed selection read flag SRTd. The internal read output clock generation circuit 463 may initialize the internal read output clock signal IROCLK to a logic "low" level if the reset signal RST is generated. The burst operation mode signal 4BG_BL32 may be set to have a logic "high" level if the read operation is performed while the burst length is set to be '32' in the bank group mode. The read output signal generation circuit 464 may generate a read output signal REX if the delayed selection read flag SRTd is generated. The read output signal generation circuit 464 may delay the delayed selection read flag SRTd to generate the read output signal REX.

The first internal read output latch 465 may be realized using a D-flip flop having an output terminal Q which is initialized to have a logic "high" level if the reset signal RST is generated. The first internal read output latch 465 may latch a signal inputted through an input terminal D, thereof, to output the latched signal through the output terminal Q in synchronization with the internal read output clock signal IROCLK if the first internal read output control signal IRPOUT<1> is generated to have a logic "high" level by the internal read output clock signal IROCLK generated a first time after the initialization operation.

The first internal read output control signal output circuit 466 may be configured to perform a NAND operation and an inversion operation. For example, the first internal read output control signal output circuit 466 may include a NAND gate NAND471 and an inverter IV471 and may perform a logical AND operation of the delayed selection read flag SRTd, the read output signal REX and a signal of the output terminal Q of the first internal read output latch 465 to generate the first internal read output control signal IRPOUT<1>. The first internal read output control signal output circuit 466 may generate the first internal read output control signal IRPOUT<1> having a logic "high" level if the internal read output clock signal IROCLK is generated a first time after the initialization operation and both of the delayed selection read flag SRTd and the read output signal REX are generated to have a logic "high" level.

The second internal read output latch 467 may be realized using a D-flip flop having an output terminal Q which is initialized to have a logic "low" level if the reset signal RST is generated. The second internal read output latch 467 may latch a signal inputted through an input terminal D, thereof, to output the latched signal through the output terminal Q in synchronization with the internal read output clock signal IROCLK if the second internal read output control signal IRPOUT<2> is generated to have a logic "high" level by the internal read output clock signal IROCLK generated a second time after the initialization operation. The second internal read output control signal output circuit 468 may include a NAND gate NAND481 and an inverter IV481 and may perform a logical AND operation of the delayed selection read flag SRTd, the read output signal REX and a signal of the output terminal Q of the second internal read output latch 467 to generate the second internal read output control signal IRPOUT<2>. The second internal read output control signal output circuit 468 may generate the second internal read output control signal IRPOUT<2> having a logic "high" level if the internal read output clock signal IROCLK is generated a second time after the initialization operation and both of the delayed selection read flag SRTd and the read output signal REX are generated to have a logic "high" level.

The third internal read output latch 469 may be realized using a D-flip flop having an output terminal Q which is initialized to have a logic "low" level if the reset signal RST is generated. A signal of the output terminal Q of the third internal read output latch 469 may be fed back to the input terminal D of the first internal read output latch 465.

The internal read output control signal generation circuit 46 may alternately generate the first and second internal read output control signals IRPOUT<1:2> whenever the internal read flag IRDTF is generated for the read operation performed while the burst length is set to be '32' in the bank group mode. For example, the internal read output control signal generation circuit 46 may generate the first internal read output control signal IRPOUT<1> if the internal read flag IRDTF is generated a first time, may generate the second internal read output control signal IRPOUT<2> if the internal read flag IRDTF is generated a second time, and may generate the first internal read output control signal IRPOUT<1> if the internal read flag IRDTF is generated a third time, and so on and so forth.

Figure 8:
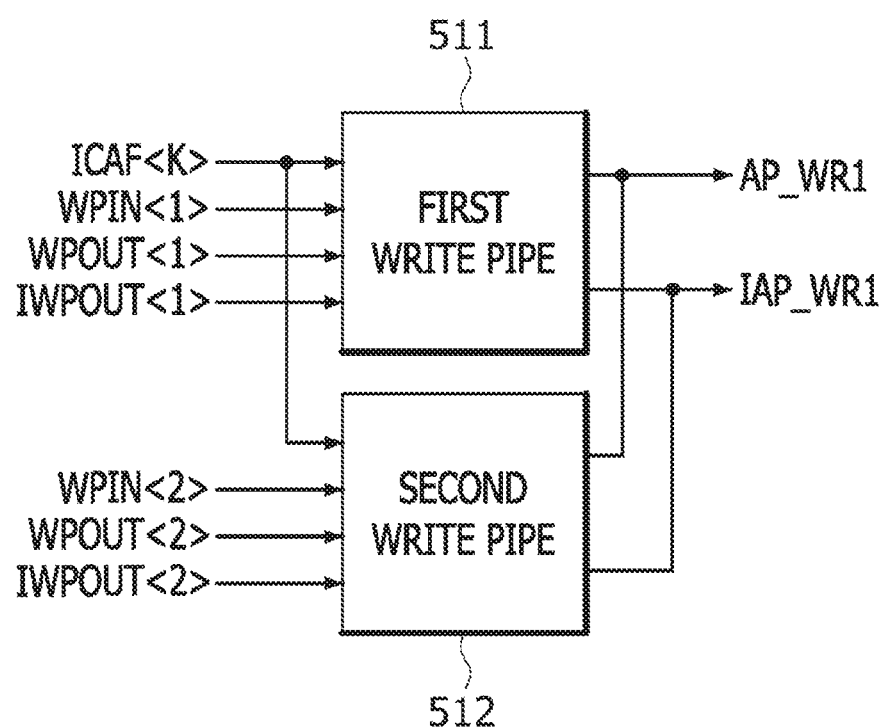
FIG. 8 is a block diagram illustrating an example of a first write pipe group included in the semiconductor device of FIG. 1.

Referring to FIG. 8, the first write pipe group 51 may include a first write pipe 511 and a second write pipe 512.

The first write pipe 511 may store the internal command/address signal ICAF<K> based on the first write input control signal WPIN<1>, and may output the stored internal command/address signal ICAF<K> as the first write latch signal AP_WR1 based on the first write output control signal WPOUT<1> or may output the stored internal command/address signal ICAF<K> as the first internal write latch signal IAP_WR1 based on the first internal write output control signal IWPOUT<1>.

The second write pipe 512 may store the internal command/address signal ICAF<K> based on the second write input control signal WPIN<2>, and may output the stored internal command/address signal ICAF<K> as the first write latch signal AP_WR1 based on the second write output control signal WPOUT<2> or may output the stored internal command/address signal ICAF<K> as the first internal write latch signal IAP_WR1 based on the second internal write output control signal IWPOUT<2>.

Figure 9:
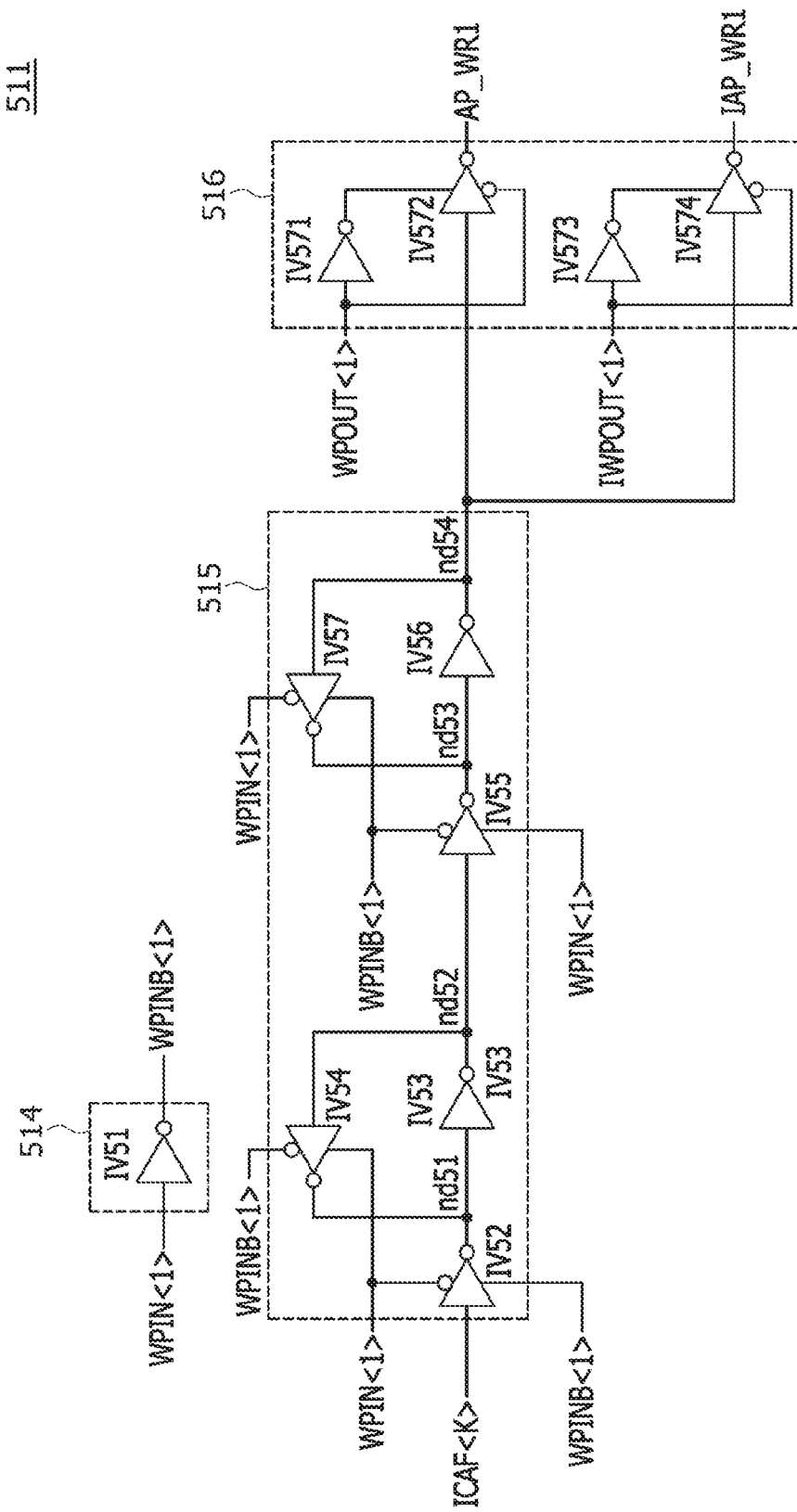
FIG. 9 is a circuit diagram illustrating an example of a first write pipe included in the first write pipe group of FIG. 8.

Referring to FIG. 9, the first write pipe 511 may include a write input inversion circuit 514, a write input control signal latch circuit 515 and a write selection output circuit 516. The write input inversion circuit 514 may be configured to perform an inversion operation. For example, the write input inversion circuit 514 may include an inverter IV51 and may inversely buffer the first write input control signal WPIN<1> to generate a first inverted write input control signal WPINB<1>. The write input control signal latch circuit 515 may be configured to perform inversion operations. For example, the write input control signal latch circuit 515 may include inverters IV52~IV57. The inverter IV52 may inversely buffer the internal command/address signal ICAF<K> to output the inversely buffered signal of the internal command/address signal ICAF<K> to a node nd51 while the first write input control signal WPIN<1> is not generated. The inverter IV53 may inversely buffer a signal of the node nd51 to output the inversely buffered signal of a signal of the node nd51 to a node nd52. The inverter IV54 may inversely buffer a signal of the node nd52 to output the inversely buffered signal of a signal of the node nd52 to the node nd51 if the first write input control signal WPIN<1> is generated to have a logic "high" level. The inverter IV55 may inversely buffer a signal of the node nd52 to output the inversely buffered signal of a signal of the node nd52 to a node nd53 if the first write input control signal WPIN<1> is generated to have a logic "high" level. The inverter IV56 may inversely buffer a signal of the node nd53 to output the inversely buffered signal of a signal of the node nd53 to a node nd54. The inverter IV57 may inversely buffer a signal of the node nd54 to output the inversely buffered signal of a signal of the node nd54 to the node nd53 while the first write input control signal WPIN<1> is not generated. The write selection output circuit 516 may be configured to perform inversion operations. For example, the write selection output circuit 516 may include inverters IV571~IV574. The inverter IV571 may inversely buffer the first write output control signal WPOUT<1> to output the inversely buffered signal of the first write output control signal WPOUT<1>. The inverter IV572 may inversely buffer a signal of the node nd54 to output the inversely buffered signal of a signal of the node nd54 as the first write latch signal AP_WR1 if the first write output control signal WPOUT<1> is generated to have a logic "low" level. The inverter IV573 may inversely buffer the first internal write output control signal IWPOUT<1> to output the inversely buffered signal of the first internal write output control signal IWPOUT<1>. The inverter IV574 may inversely buffer a signal of the node nd54 to output the inversely buffered signal of a signal of the node nd54 as the first internal write latch signal IAP_WR1 if the first internal write output control signal IWPOUT<1> is generated to have a logic "low" level.

Figure 10:
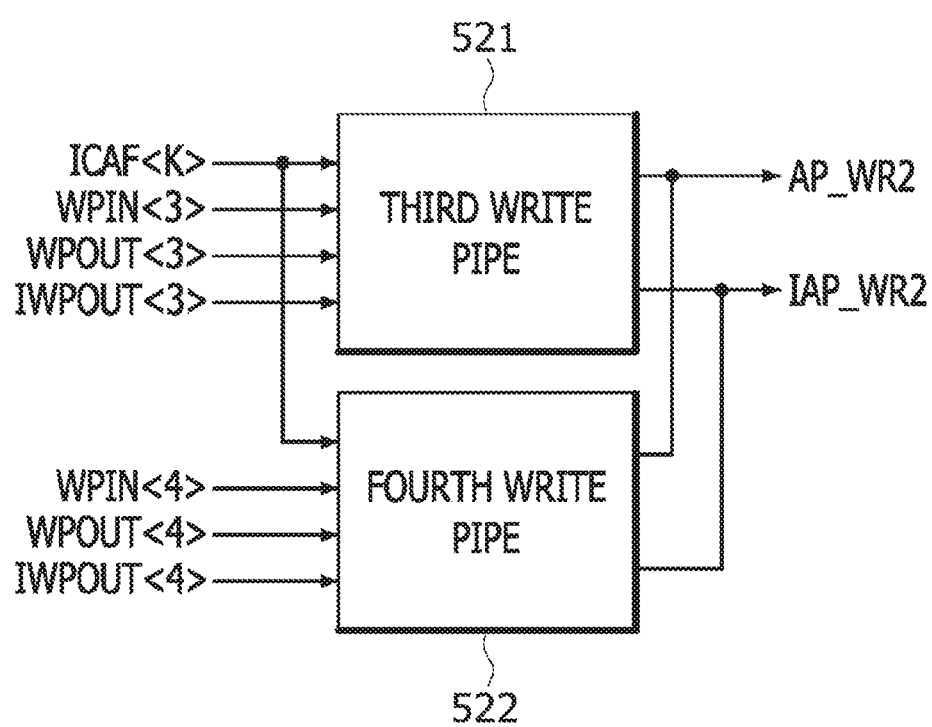
FIG. 10 is a block diagram illustrating an example of a second write pipe group included in the semiconductor device of FIG. 1.

Referring to FIG. 10, the second write pipe group 52 may include a third write pipe 521 and a fourth write pipe 522.

The third write pipe 521 may store the internal command/address signal ICAF<K> based on the third write input control signal WPIN<3>, and may output the stored internal command/address signal ICAF<K> as the second write latch signal AP_WR2 based on the third write output control signal WPOUT<3> or may output the stored internal command/address signal ICAF<K> as the second internal write latch signal IAP_WR2 based on the third internal write output control signal IWPOUT<3>.

The fourth write pipe 522 may store the internal command/address signal ICAF<K> based on the fourth write input control signal WPIN<4>, and may output the stored internal command/address signal ICAF<K> as the second write latch signal AP_WR2 based on the fourth write output control signal WPOUT<4> or may output the stored internal command/address signal ICAF<K> as the second internal write latch signal IAP_WR2 based on the fourth internal write output control signal IWPOUT<4>.

Figure 11:
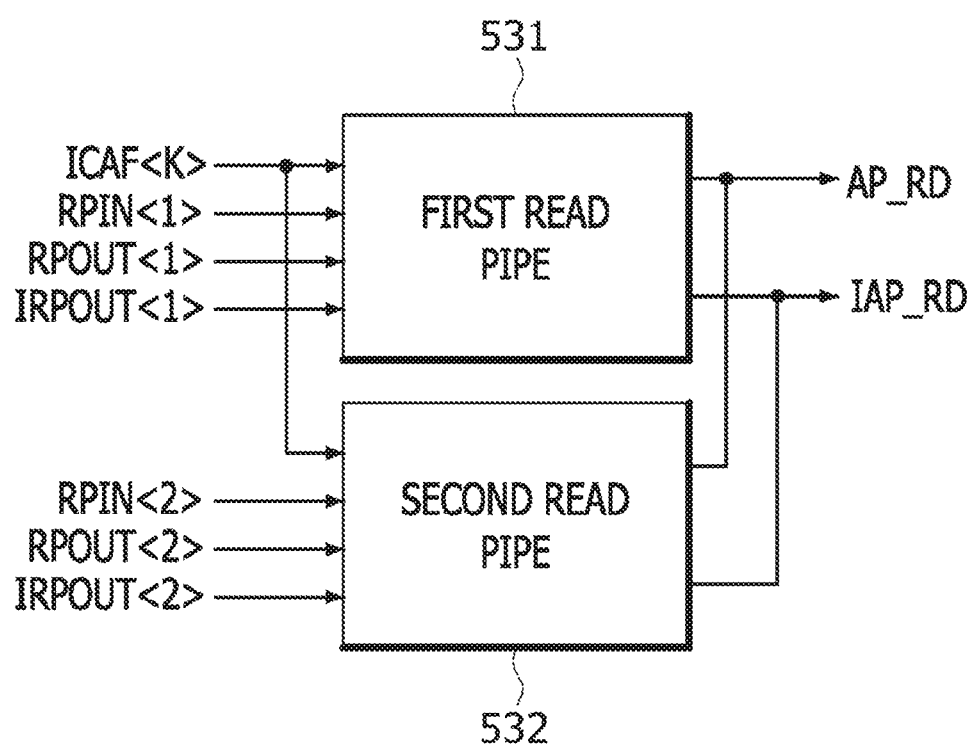
FIG. 11 is a block diagram illustrating an example of a read pipe group included in the semiconductor device of FIG. 1.

Referring to FIG. 11, the read pipe group 53 may include a first read pipe 531 and a second read pipe 532.

The first read pipe 531 may store the internal command/address signal ICAF<K> based on the first read input control signal RPIN<1>, and may output the stored internal command/address signal ICAF<K> as the read latch signal AP_RD based on the first read output control signal RPOUT<1> or may output the stored internal command/address signal ICAF<K> as the internal read latch signal IAP_RD based on the first internal read output control signal IRPOUT<1>.

The second read pipe 532 may store the internal command/address signal ICAF<K> based on the second read input control signal RPIN<2>, and may output the stored internal command/address signal ICAF<K> as the read latch signal AP_RD based on the second read output control signal RPOUT<2> or may output the stored internal command/address signal ICAF<K> as the internal read latch signal IAP_RD based on the second internal read output control signal IRPOUT<2>.

Figure 12:
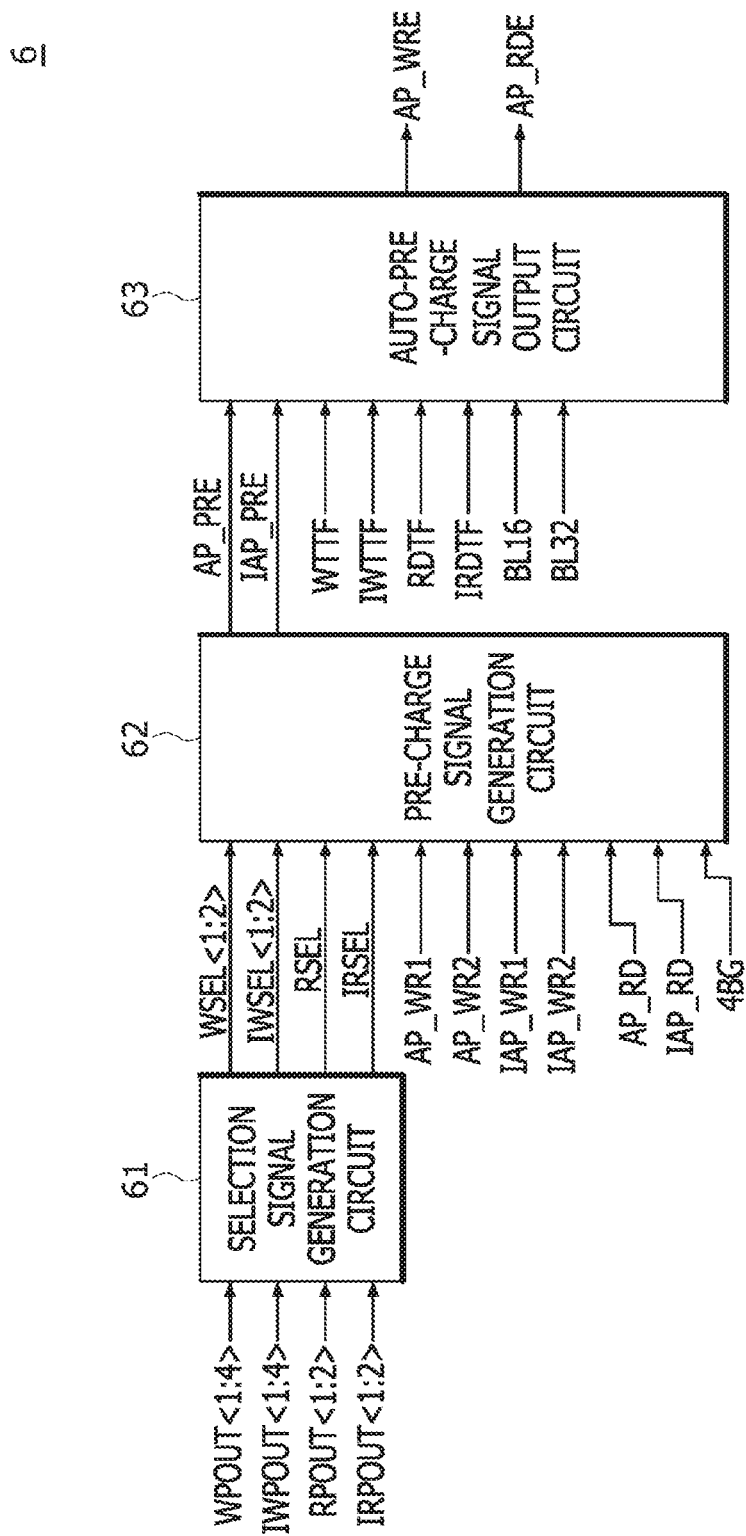
FIG. 12 is a block diagram illustrating an example of an auto-pre-charge signal generation circuit included in the semiconductor device of FIG. 1.

Referring to FIG. 12, the auto-pre-charge signal generation circuit 6 may include a selection signal generation circuit 61, a pre-charge signal generation circuit 62 and an auto-pre-charge signal output circuit 63.

The selection signal generation circuit 61 may generate first and second write selection signals WSEL<1:2> based on the first to fourth write output control signals WPOUT<1:

4>. The selection signal generation circuit 61 may generate the first write selection signal WSEL<1> if the first or second write output control signal WPOUT<1> or WPOUT<2> is generated. The selection signal generation circuit 61 may generate the second write selection signal WSEL<2> if the third or fourth write output control signal WPOUT<3> or WPOUT<4> is generated.

The selection signal generation circuit 61 may generate first and second internal write selection signals IWSEL<1:2> based on the first to fourth internal write output control signals IWPOUT<1:4>. The selection signal generation circuit 61 may generate the first internal write selection signal IWSEL<1> if the first or second internal write output control signal IWPOUT<1> or IWPOUT<2> is generated. The selection signal generation circuit 61 may generate the second internal write selection signal IWSEL<2> if the third or fourth internal write output control signal IWPOUT<3> or IWPOUT<4> is generated.

The selection signal generation circuit 61 may generate a read selection signal RSEL based on the first and second read output control signals RPOUT<1:2>. The selection signal generation circuit 61 may generate the read selection signal RSEL if the first or second read output control signal RPOUT<1> or RPOUT<2> is generated.

The selection signal generation circuit 61 may generate an internal read selection signal IRSEL based on the first and second internal read output control signals IRPOUT<1:2>. The selection signal generation circuit 61 may generate the internal read selection signal IRSEL if the first or second internal read output control signal IRPOUT<1> or IRPOUT<2> is generated.

The pre-charge signal generation circuit 62 may generate a pre-charge signal AP_PRE and an internal pre-charge signal IAP_PRE from the first write latch signal AP_WR1, the first internal write latch signal IAP_WR1, the second write latch signal AP_WR2, the second internal write latch signal IAP_WR2, the read latch signal AP_RD or the internal read latch signal IAP_RD based on the first and second write selection signals WSEL<1:2>, the first and second internal write selection signals IWSEL<1:2>, the read selection signal RSEL, the internal read selection signal IRSEL and the operation mode signal 4BG.

The pre-charge signal generation circuit 62 may buffer the first write latch signal AP_WR1 to generate the pre-charge signal AP_PRE and the internal pre-charge signal IAP_PRE if the first write selection signal WSEL<1> is generated in a non-bank group mode. The pre-charge signal generation circuit 62 may buffer the first write latch signal AP_WR1 to generate the pre-charge signal AP_PRE if the first write selection signal WSEL<1> is generated in the bank group mode.

The pre-charge signal generation circuit 62 may buffer the second write latch signal AP_WR2 to generate the pre-charge signal AP_PRE and the internal pre-charge signal IAP_PRE if the second write selection signal WSEL<2> is generated in a non-bank group mode. The pre-charge signal generation circuit 62 may buffer the second write latch signal AP_WR2 to generate the pre-charge signal AP_PRE if the second write selection signal WSEL<2> is generated in the bank group mode.

The pre-charge signal generation circuit 62 may buffer the read latch signal AP_RD to generate the pre-charge signal AP_PRE and the internal pre-charge signal IAP_PRE if the read selection signal RSEL is generated in a non-bank group mode. The pre-charge signal generation circuit 62 may buffer the read latch signal AP_RD to generate the pre-charge signal AP_PRE if the read selection signal RSEL is generated in the bank group mode.

The pre-charge signal generation circuit 62 may buffer the first internal write latch signal IAP_WR1 to generate the internal pre-charge signal IAP_PRE if the first internal write selection signal IWSEL<1> is generated in the bank group mode. The pre-charge signal generation circuit 62 may buffer the second internal write latch signal IAP_WR2 to generate the internal pre-charge signal IAP_PRE if the second internal write selection signal IWSEL<2> is generated in the bank group mode. The pre-charge signal generation circuit 62 may buffer the internal read latch signal IAP_RD to generate the internal pre-charge signal IAP_PRE if the internal read selection signal IRSEL is generated in the bank group mode.

The auto-pre-charge signal output circuit 63 may generate the write auto-pre-charge signal AP_WRE and the read auto-pre-charge signal AP_RDE from the pre-charge signal AP_PRE and the internal pre-charge signal IAP_PRE based on the write flag WTTF, the internal write flag IWTTF, the read flag RDTF, the internal read flag IRDTF, the first burst mode signal BL16 and the second burst mode signal BL32.

The auto-pre-charge signal output circuit 63 may generate the write auto-pre-charge signal AP_WRE from the pre-charge signal AP_PRE if the write flag WTTF is generated. The auto-pre-charge signal output circuit 63 may generate the read auto-pre-charge signal AP_RDE from the pre-charge signal AP_PRE if the read flag RDTF is generated. The auto-pre-charge signal output circuit 63 may generate the write auto-pre-charge signal AP_WRE from the internal pre-charge signal IAP_PRE if the internal write flag IWTTF is generated. The auto-pre-charge signal output circuit 63 may generate the read auto-pre-charge signal AP_RDE from the internal pre-charge signal IAP_PRE if the internal read flag IRDTF is generated.

Referring to FIG. 13, the selection signal generation circuit 61 may be configured to perform OR operations. For example, the selection signal generation circuit 61 may include OR gates OR611~OR616. The OR gate OR611 may perform a logical OR operation of the first and second write output control signals WPOUT<1:2> to generate the first write selection signal WSEL<1>. The OR gate OR611 may generate the first write selection signal WSEL<1> if the first or second write output control signal WPOUT<1> or WPOUT<2> is generated. The OR gate OR612 may perform a logical OR operation based on the third and fourth write output control signals WPOUT<3:4> to generate the second write selection signal WSEL<2>. The OR gate OR612 may generate the second write selection signal WSEL<2> if the third or fourth write output control signal WPOUT<3> or WPOUT<4> is generated. The OR gate OR613 may perform a logical OR operation based on the first and second read output control signals RPOUT<1:2> to generate the read selection signal RSEL. The OR gate OR613 may generate the read selection signal RSEL if the first or second read output control signal RPOUT<1> or RPOUT<2> is generated. The OR gate OR614 may perform a logical OR operation based on the first and second internal write output control signals IWPOUT<1:2> to generate the first internal write selection signal IWSEL<1>. The OR gate OR614 may generate the first internal write selection signal IWSEL<1> if the first or second internal write output control signal IWPOUT<1> or IWPOUT<2> is generated. The OR gate OR615 may perform a logical OR operation based on the third and fourth internal write output control signals IWPOUT<3:4> to generate the second internal write selection signal IWSEL<2>. The OR gate OR615 may generate the second internal write selection signal IWSEL<2> if the third or fourth internal write output control signal IWPOUT<3> or IWPOUT<4> is generated. The OR gate OR616 may perform a logical OR operation based on the first and second internal read output control signals IRPOUT<1:2> to generate the internal read selection signal IRSEL. The OR gate OR616 may generate the internal read selection signal IRSEL if the first or second internal read output control signal IRPOUT<1> or IRPOUT<2> is generated.

Figure 14:
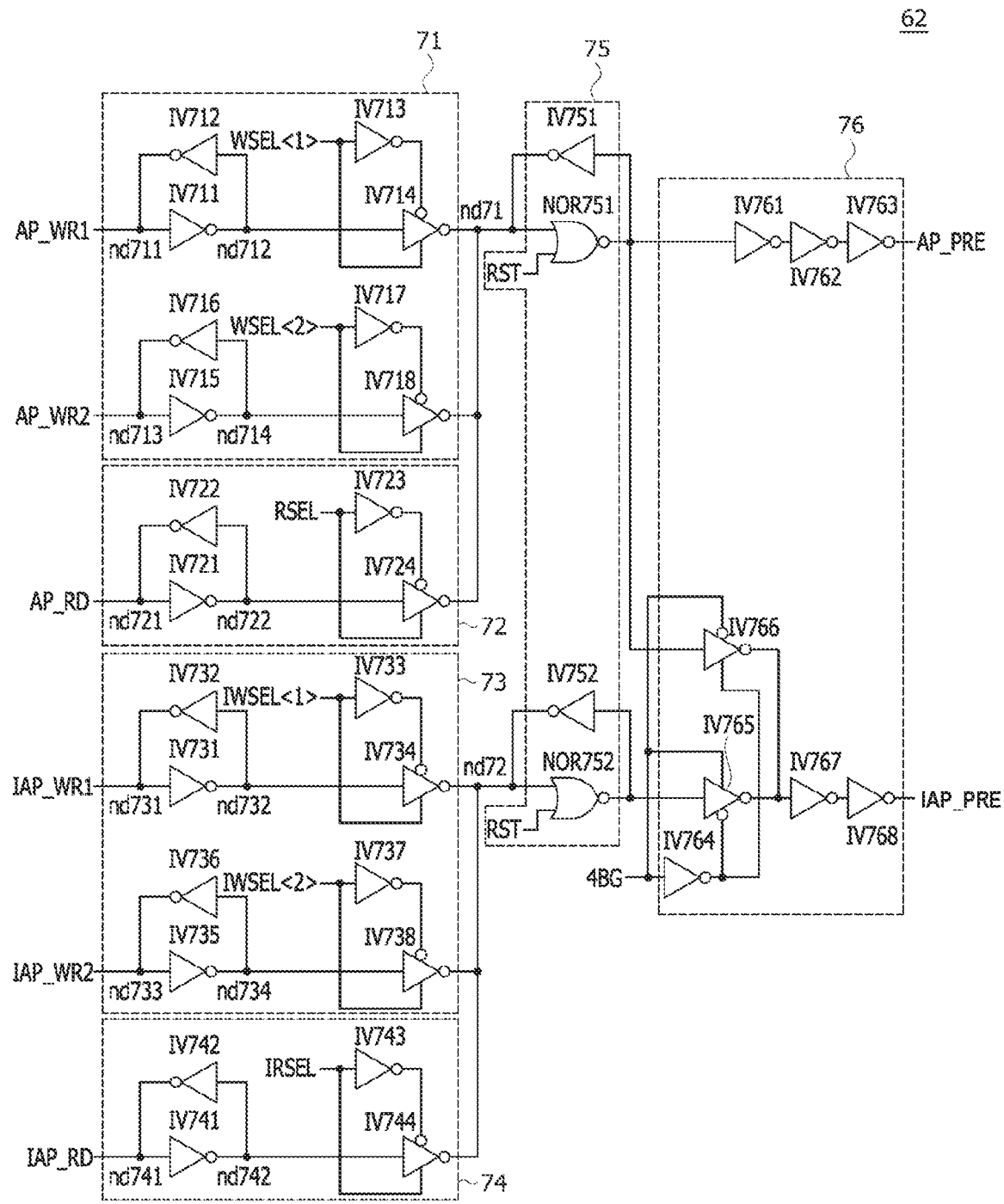
FIG. 14 is a circuit diagram illustrating an example of a pre-charge signal generation circuit included in the auto-pre-charge signal generation circuit of FIG. 12.

Referring to FIG. 14, the pre-charge signal generation circuit 62 may include a write latch signal selection input circuit 71, a read latch signal selection input circuit 72, an internal write latch signal selection input circuit 73, an internal read latch signal selection input circuit 74, a selection latch circuit 75 and a pre-output circuit 76.

The write latch signal selection input circuit 71 may be configured to perform inversion operations. For example, the write latch signal selection input circuit 71 may include inverters IV711~IV718. The inverter IV711 may inversely buffer the first write latch signal AP_WR1 inputted through a node nd711 to output the inversely buffered signal of the first write latch signal AP_WR1 to a node nd712. The inverter IV712 may inversely buffer a signal of the node nd712 to output the inversely buffered signal of a signal of the node nd712 to the node nd711. The inverter IV713 may inversely buffer the first write selection signal WSEL<1> to output the inversely buffered signal of the first write selection signal WSEL<1>. The inverter IV714 may inversely buffer a signal of the node nd712 to output the inversely buffered signal of a signal of the node 712 to a node nd71 if the first write selection signal WSEL<1> is generated to have a logic "high" level. The inverter IV715 may inversely buffer the second write latch signal AP_WR2 inputted through a node nd713 to output the inversely buffered signal of the second write latch signal AP_WR2 to a node nd714. The inverter IV716 may inversely buffer a signal of the node nd714 to output the inversely buffered signal of a signal of the node nd714 to the node nd713. The inverter IV717 may inversely buffer the second write selection signal WSEL<2> to output the inversely buffered signal of the second write selection signal WSEL<2>. The inverter IV718 may inversely buffer a signal of the node nd714 to output the inversely buffered signal of a signal of the node 714 to the node nd71 if the second write selection signal WSEL<2> is generated to have a logic "high" level. The write latch signal selection input circuit 71 may buffer the first write latch signal AP_WR1 to output the buffered signal of the first write latch signal AP_WR1 to the node nd71 if the first write selection signal WSEL<1> is generated and may buffer the second write latch signal AP_WR2 to output the buffered signal of the second write latch signal AP_WR2 to the node nd71 if the second write selection signal WSEL<2> is generated.

The read latch signal selection input circuit 72 may be configured to perform inversion operations. For example, the read latch signal selection input circuit 72 may include inverters IV721~IV724. The inverter IV721 may inversely buffer the read latch signal AP_RD inputted through a node nd721 to output the inversely buffered signal of the read latch signal AP_RD to a node nd722. The inverter IV722 may inversely buffer a signal of the node nd722 to output the inversely buffered signal of a signal of the node nd722 to the node nd721. The inverter IV723 may inversely buffer the read selection signal RSEL to output the inversely buffered signal of the read selection signal RSEL. The inverter IV724 may inversely buffer a signal of the node nd722 to output the inversely buffered signal of a signal of the node 722 to the node nd71 if the read selection signal RSEL is generated to have a logic "high" level. The read latch signal selection input circuit 72 may buffer the read latch signal AP_RD to output the buffered signal of the read latch signal AP_RD to the node nd71 if the read selection signal RSEL is generated.

The internal write latch signal selection input circuit 73 may be configured to perform inversion operations. For example, the internal write latch signal selection input circuit 73 may include inverters IV731~IV738. The inverter IV731 may inversely buffer the first internal write latch signal IAP_WR1 inputted through a node nd731 to output the inversely buffered signal of the first internal write latch signal IAP_WR1 to a node nd732. The inverter IV732 may inversely buffer a signal of the node nd732 to output the inversely buffered signal of a signal of the node nd732 to the node nd731. The inverter IV733 may inversely buffer the first internal write selection signal IWSEL<1> to output the inversely buffered signal of the first internal write selection signal IWSEL<1>. The inverter IV734 may inversely buffer a signal of the node nd732 to output the inversely buffered signal of a signal of the node 732 to a node nd72 if the first internal write selection signal IWSEL<1> is generated to have a logic "high" level. The inverter IV735 may inversely buffer the second internal write latch signal IAP_WR2 inputted through a node nd733 to output the inversely buffered signal of the second internal write latch signal IAP_WR2 to a node nd734. The inverter IV736 may inversely buffer a signal of the node nd734 to output the inversely buffered signal of a signal of the node nd734 to the node nd733. The inverter IV737 may inversely buffer the second internal write selection signal IWSEL<2> to output the inversely buffered signal of the second internal write selection signal IWSEL<2>. The inverter IV738 may inversely buffer a signal of the node nd734 to output the inversely buffered signal of a signal of the node 734 to the node nd72 if the second internal write selection signal IWSEL<2> is generated to have a logic "high" level. The internal write latch signal selection input circuit 73 may buffer the first internal write latch signal IAP_WR1 to output the buffered signal of the first internal write latch signal IAP_WR1 to the node nd72 if the first internal write selection signal IWSEL<1> is generated and may buffer the second internal write latch signal IAP_WR2 to output the buffered signal of the second internal write latch signal IAP_WR2 to the node nd72 if the second internal write selection signal IWSEL<2> is generated.

The internal read latch signal selection input circuit 74 may be configured to perform inversion operations. For example, the internal read latch signal selection input circuit 74 may include inverters IV741~IV744. The inverter IV741 may inversely buffer the internal read latch signal IAP_RD inputted through a node nd741 to output the inversely buffered signal of the internal read latch signal IAP_RD to a node nd742. The inverter IV742 may inversely buffer a signal of the node nd742 to output the inversely buffered signal of a signal of the node nd742 to the node nd741. The inverter IV743 may inversely buffer the internal read selection signal IRSEL to output the inversely buffered signal of the internal read selection signal IRSEL. The inverter IV744 may inversely buffer a signal of the node nd742 to output the inversely buffered signal of a signal of the node 742 to the node nd72 if the internal read selection signal IRSEL is generated to have a logic "high" level. The internal read latch signal selection input circuit 74 may buffer the internal read latch signal IAP_RD to output the buffered signal of the internal read latch signal IAP_RD to the node nd72 if the internal read selection signal IRSEL is generated.

The selection latch circuit 75 may be configured to perform NOR operations and inversion operations. For example, the selection latch circuit 75 may include NOR gates NOR751 and NOR752 and inverters IV751 and IV752. The NOR gate NOR751 may perform a logical NOR operation based on a signal of the node nd71 and the reset signal RST. The inverter IV751 may inversely buffer an output signal of the NOR gate NOR751 to output the inversely buffered signal of an output signal of the NOR gate NOR751 to the node nd71. The NOR gate NOR752 may perform a logical NOR operation based on a signal of the node nd72 and the reset signal RST. The inverter IV752 may inversely buffer an output signal of the NOR gate NOR752 to output the inversely buffered signal of an output signal of the NOR gate NOR752 to the node nd72. The selection latch circuit 75 may latch signals of the nodes nd71 and nd72 and may buffer the signals of the nodes nd71 and nd72 to output one of the buffered signals of the signals of the nodes nd71 and nd72 as the pre-charge signal AP_PRE.

The pre-output circuit 76 may be configured to perform inversion operations. For example, the pre-output circuit 76 may include inverters IV761~IV768. The inverters IV761, IV762 and IV763 may be coupled in series and may inversely buffer an output signal of the NOR gate NOR751 to output the inversely buffered signal of an output signal of the NOR gate NOR751 as the pre-charge signal AP_PRE. The inverter IV764 may inversely buffer the operation mode signal 4BG to output the inversely buffered signal of the operation mode signal 4BG. The inverter IV765 may inversely buffer an output signal of the NOR gate NOR752 to output the inversely buffered signal of the output signal of the NOR gate NOR752 in the bank group mode. The inverter IV766 may inversely buffer an output signal of the NOR gate NOR751 to output the inversely buffered signal of an output signal of the NOR gate NOR751 in a non-bank group mode. The inverters IV767 and IV768 may be coupled in series and may buffer an output signal of the inverter IV765 or IV766 to output the buffered signal of an output signal of the inverter IV765 or IV766 as the internal pre-charge signal IAP_PRE.

The pre-charge signal generation circuit 62 may buffer the first internal write latch signal IAP_WR1 to generate the internal pre-charge signal IAP_PRE if the first internal write selection signal IWSEL<1> is generated in the bank group mode. The pre-charge signal generation circuit 62 may buffer the second internal write latch signal IAP_WR2 to generate the internal pre-charge signal IAP_PRE if the second internal write selection signal IWSEL<2> is generated in the bank group mode. The pre-charge signal generation circuit 62 may buffer the internal read latch signal IAP_RD to generate the internal pre-charge signal IAP_PRE if the internal read selection signal IRSEL is generated in the bank group mode.

Figure 15:
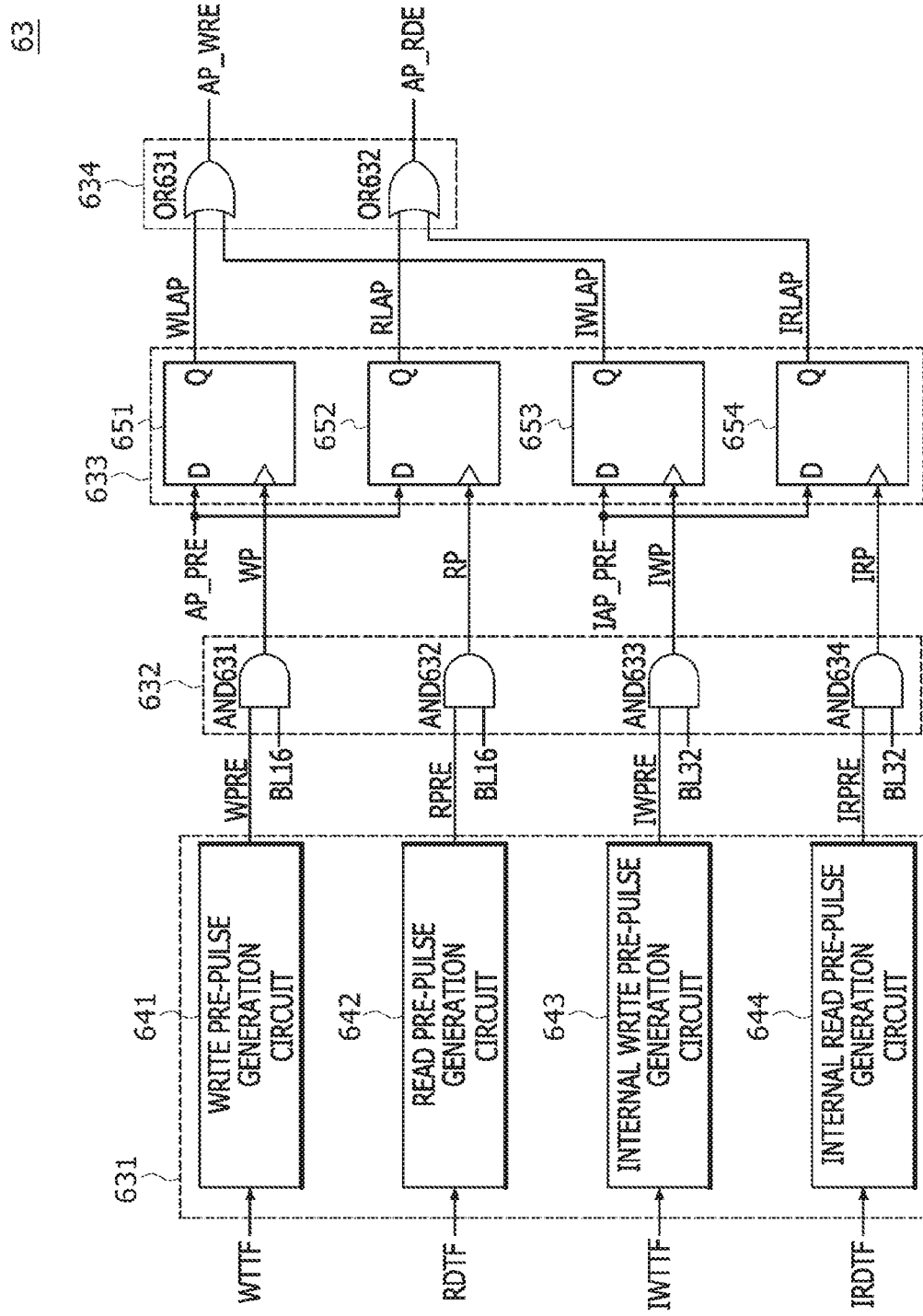
FIG. 15 illustrates an example of an auto-pre-charge signal output circuit included in the auto-pre-charge signal generation circuit of FIG. 12.

Referring to FIG. 15, the auto-pre-charge signal output circuit 63 may include a pre-pulse generation circuit 631, a pulse generation circuit 632, a latched pulse generation circuit 633 and a latched pulse synthesis circuit 634.

The pre-pulse generation circuit 631 may include a write pre-pulse generation circuit 641, a read pre-pulse generation circuit 642, an internal write pre-pulse generation circuit 643 and an internal read pre-pulse generation circuit 644. The write pre-pulse generation circuit 641 may generate a write pre-pulse WPRE from the write flag WTTF. The write pre-pulse generation circuit 641 may delay the write flag WTTF to generate the write pre-pulse WPRE. A delay time of the write pre-pulse generation circuit 641 for delaying the write flag WTTF may be set to be different according to the embodiments. The read pre-pulse generation circuit 642 may generate a read pre-pulse RPRE from the read flag RDTF. The read pre-pulse generation circuit 642 may delay the read flag RDTF to generate the read pre-pulse RPRE. A delay time of the read pre-pulse generation circuit 642 for delaying the read flag RDTF may be set to be different according to the embodiments. The internal write pre-pulse generation circuit 643 may generate an internal write pre-pulse IWPRE from the internal write flag IWTTF. The internal write pre-pulse generation circuit 643 may delay the internal write flag IWTTF to generate the internal write pre-pulse IWPRE. A delay time of the internal write pre-pulse generation circuit 643 for delaying the internal write flag IWTTF may be set to be different according to the embodiments. The internal read pre-pulse generation circuit 644 may generate an internal read pre-pulse IRPRE from the internal read flag IRDTF. The internal read pre-pulse generation circuit 644 may delay the internal read flag IRDTF to generate the internal read pre-pulse IRPRE. A delay time of the internal read pre-pulse generation circuit 644 for delaying the internal read flag IRDTF may be set to be different according to the embodiments.

The pulse generation circuit 632 may be configured to perform AND operations. For example, the pre pulse generation circuit 632 may include AND gates AND631~AND634. The AND gate AND631 may perform a logical AND operation based on the write pre-pulse WPRE and the first burst mode signal BL16 to generate a write pulse WP. The AND gate AND631 may generate the write pulse WP if the write pre-pulse WPRE is generated while the burst length is set to be '16'. The AND gate AND632 may perform a logical AND operation based on the read pre-pulse RPRE and the first burst mode signal BL16 to generate a read pulse RP. The AND gate AND632 may generate the read pulse RP if the read pre-pulse RPRE is generated while the burst length is set to be '16'. The AND gate AND633 may perform a logical AND operation based on the internal write pre-pulse IWPRE and the second burst mode signal BL32 to generate an internal write pulse IWP. The AND gate AND633 may generate the internal write pulse IWP if the internal write pre-pulse IWPRE is generated while the burst length is set to be '32'. The AND gate AND634 may perform a logical AND operation based on the internal read pre-pulse IRPRE and the second burst mode signal BL32 to generate an internal read pulse IRP. The AND gate AND634 may generate the internal read pulse IRP if the internal read pre-pulse IRPRE is generated while the burst length is set to be '32'.

The latched pulse generation circuit 633 may include a write latched pulse generation circuit 651, a read latched pulse generation circuit 652, an internal write latched pulse generation circuit 653 and an internal read latched pulse generation circuit 654. The write latched pulse generation circuit 651 may latch the pre-charge signal AP_PRE to output the latched signal of the pre-charge signal AP_PRE as a write latched pulse WLAP if the write pulse WP is generated. The read latched pulse generation circuit 652 may latch the pre-charge signal AP_PRE to output the latched signal of the pre-charge signal AP_PRE as a read latched pulse RLAP if the read pulse RP is generated. The internal write latched pulse generation circuit 653 may latch the internal pre-charge signal IAP_PRE to output the latched signal of the internal pre-charge signal IAP_PRE as an internal write latched pulse IWLAP if the internal write pulse IWP is generated. The internal read latched pulse generation circuit 654 may latch the internal pre-charge signal IAP_PRE to output the latched signal of the internal pre-charge signal IAP_PRE as an internal read latched pulse IRLAP if the internal read pulse IRP is generated. Each of the write latched pulse generation circuit 651, the read latched pulse generation circuit 652, the internal write latched pulse generation circuit 653 and the internal read latched pulse generation circuit 654 may be realized using a D-flip flop.

The latched pulse synthesis circuit 634 may be configured to perform AND operations. For example, the latched pulse synthesis circuit 634 may include OR gates OR631 and OR632. The OR gate OR631 may perform a logical OR operation based on the write latched pulse WLAP and the internal write latched pulse IWLAP to generate the write auto-pre-charge signal AP_WRE. The OR gate OR631 may generate the write auto-pre-charge signal AP_WRE if the write latched pulse WLAP or the internal write latched pulse IWLAP is generated. The OR gate OR632 may perform a logical OR operation based on the read latched pulse RLAP and the internal read latched pulse IRLAP to generate the read auto-pre-charge signal AP_RDE. The OR gate OR632 may generate the read auto-pre-charge signal AP_RDE if the read latched pulse RLAP or the internal read latched pulse IRLAP is generated.

Figure 16:
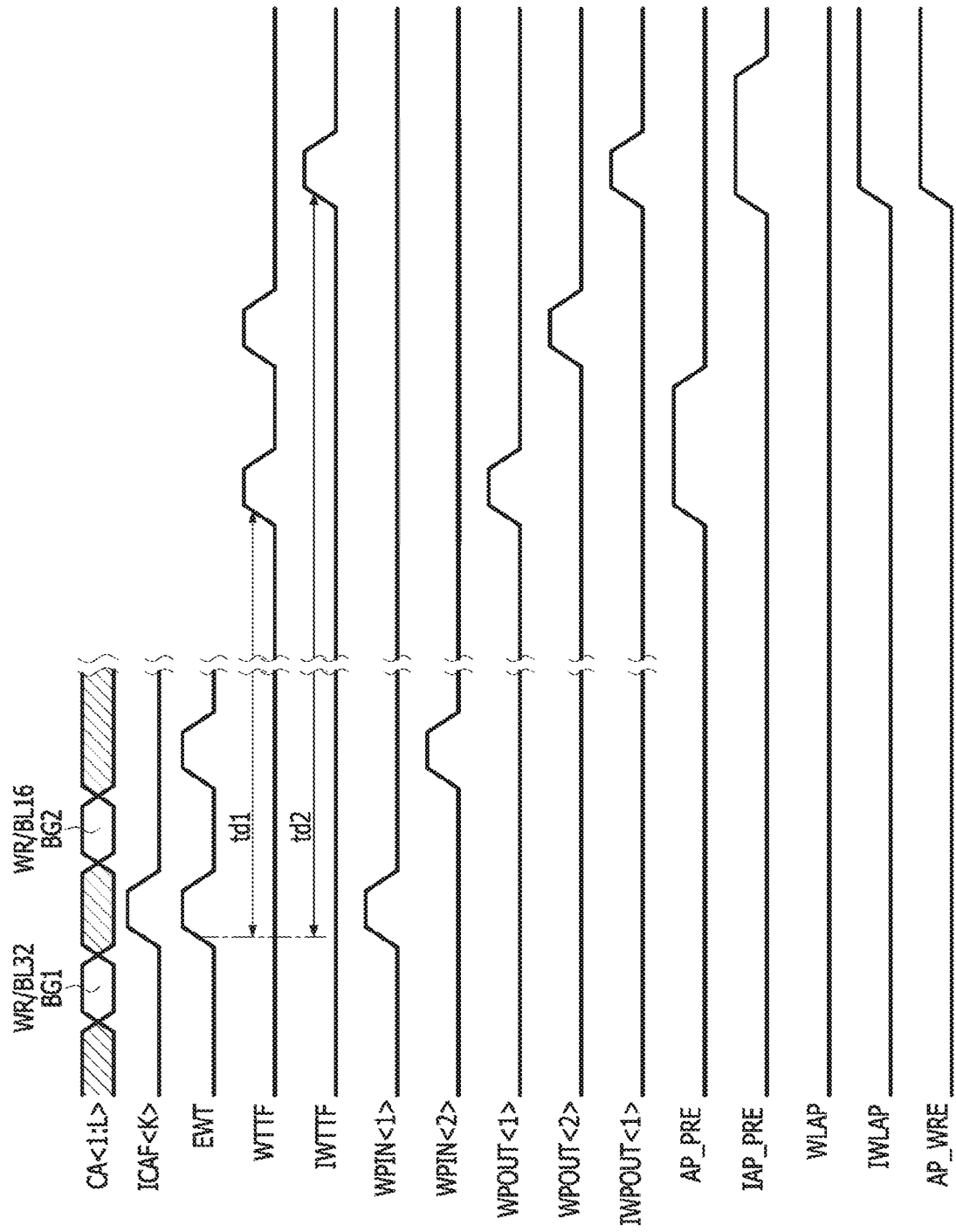
FIG. 16 is a timing diagram illustrating an operation of the semiconductor device shown in FIGS. 1 to 15.

An operation of the semiconductor device having the aforementioned configuration will be described hereinafter with reference to FIG. 16 in conjunction with an example in which the write auto-pre-charge signal AP_WRE is generated for the purpose of executing the auto-pre-charge operation in the case that a write operation with the burst length of '32' and a write operation with the burst length of '16' are sequentially performed in the bank group mode.

If a first command WR/BL32_BG1 is inputted to the semiconductor device 1 through the command/address signal CA<1:L> to perform a write operation of a first bank group with the burst length of '32' in the bank group mode, the write signal EWT may be generated a first time. If a second command WR/BL16_BG2 is inputted to the semiconductor device 1 through the command/address signal CA<1:L> to perform a write operation of a second bank group with the burst length of '16' in the bank group mode, the write signal EWT may be generated a second time. When the write signal EWT is generated a first time, the internal command/address signal ICAF<K> may be generated to have a logic "high" level for execution of the auto-pre-charge operation.

The write flag WTTF may be generated by delaying the write signal EWT by a first write delay period td1 set by the write latency. The internal write flag IWTTF may be generated by delaying the write signal EWT by a second write delay period td2 set by the write latency and the burst length.

The first write input control signal WPIN<1> may be generated if the write signal EWT is generated a first time, and the second write input control signal WPIN<2> may be generated if the write signal EWT is generated a second time. The first write output control signal WPOUT<1> may be generated if the write flag WTTF is generated a first time, and the second write output control signal WPOUT<2> may be generated if the write flag WTTF is generated a second time. The first internal write output control signal IWPOUT<1> may be generated if the internal write flag IWTTF is generated a first time. The second internal write output control signal IWPOUT<2> is not generated even when the internal write flag IWTTF is generated a second time. This is because the internal write flag IWTTF, which is generated a second time, is created by a write operation performed in the bank group with the burst length of '16'.

The internal command/address signal ICAF<K> having a logic "high" level may be latched by the first write input control signal WPIN<1>, the latched signal of the internal command/address signal ICAF<K> may be outputted as the pre-charge signal AP_PRE by the first write output control signal WPOUT<1>, and the latched signal of the internal command/address signal ICAF<K> may be outputted as the internal pre-charge signal IAP_PRE by the first internal write output control signal IWPOUT<1>. Since the pre-charge signal AP_PRE and the internal pre-charge signal IAP_PRE are generated by the write operation performed with the burst length of '32' in the bank group mode, the internal write latched pulse IWLAP may be generated to have a logic "high" level by the internal pre-charge signal IAP_PRE while the write latched pulse WLAP is not generated by the pre-charge signal AP_PRE. Thus, the auto-pre-charge operation may be performed after the write operation is performed with the burst length of '32' in the bank group mode.

As described above, a semiconductor device, according to an embodiment, may be controlled in such a way that a first column operation for a first 16-bit data is performed before a bubble period and an auto-pre-charge operation is performed by the internal pre-charge signal IAP_PRE generated after a second column operation for a second 16-bit data is performed after the bubble period, when a write operation is performed with a burst length of '32' in a bank group mode. Thus, when a write operation set with a burst length of '16' and a write operation set with a burst length of '32' are sequentially performed in the bank group mode, the execution or non-execution of the auto-pre-charge operation for the write operation performed with the burst length of '32' after the bubble period may be determined after the execution or non-execution of the auto-pre-charge operation for the write operation performed with the burst length of '16' during the bubble period is determined. That is, according to the embodiment, when write operations are successively performed, the execution or non-execution of the auto-pre-charge operation may be controlled in consideration of the burst length and the bubble period.

Figure 17:
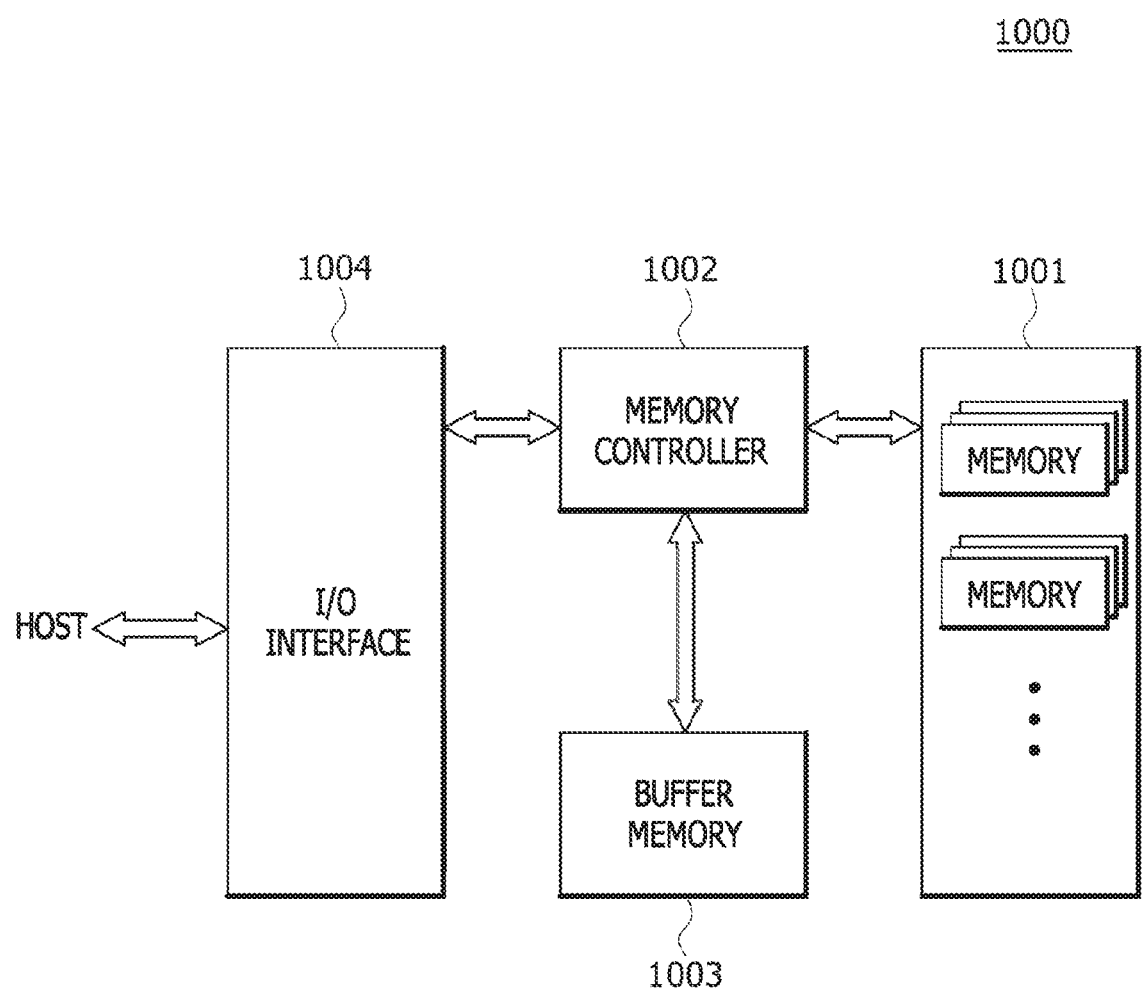
FIG. 17 is a block diagram illustrating a configuration of an electronic system employing the semiconductor device illustrated in FIG. 1.

The semiconductor device 1 described with reference to FIGS. 1 to 16 may be applied to an electronic system that includes a memory system, a graphic system, a computing system, a mobile system, or the like. For example, as illustrated in FIG. 17, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the semiconductor device 1 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device)

through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 17 illustrates the memory controller 1002 with a single block, the memory controller 1002 may include one controller for controlling the data storage circuit 1001 and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read out the data stored therein and may output the data to the memory controller 1002. The buffer memory 1003 may include a volatile memory such as a dynamic random access memory (DRAM), a mobile DRAM, or a static random access memory (SRAM). The buffer memory 1003 may include the semiconductor device 1 illustrated in FIG. 1.

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
    an input/output (I/O) control signal generation circuit configured to generate an input control signal, an output control signal and an internal output control signal based on a bank mode and a burst length;
    a pipe circuit configured to latch an internal command/address signal based on the input control signal and configured to output the latched internal command/address signal as a latch signal based on the output control signal and to output the latched internal command/address signal as an internal latch signal based on the internal output control signal; and
    an auto-pre-charge signal generation circuit configured to generate an auto-pre-charge signal from the latch signal and the internal latch signal based on the bank mode and the burst length.

2. The semiconductor device of claim 1, wherein the I/O control signal generation circuit generates the internal output control signal in a bank group mode, in which a column operation is performed before and after a bubble period, and
    wherein the bubble period is a duration of an other column operation.

3. The semiconductor device of claim 2, wherein the I/O control signal generation circuit inhibits a generation of the internal output control signal if column operations are performed without the bubble period in the bank group mode and in a non-bank group mode.

4. The semiconductor device of claim 1, wherein the I/O control signal generation circuit generates a write input control signal based on a write signal and generates a write output control signal and an internal write output control signal based on a write flag and an internal write flag.

5. The semiconductor device of claim 4,
    wherein the write flag is generated by delaying the write signal by a period set according to a write latency; and
    wherein the internal write flag is generated by delaying the write flag by a period set according to the burst length.

6. The semiconductor device of claim 4,
    wherein the write input control signal includes first and second write input control signals; and
    wherein the I/O control signal generation circuit includes a write input control signal generation circuit that is configured to sequentially and repeatedly generate the first and second write input control signals whenever the write signal is generated.

7. The semiconductor device of claim 4,
    wherein the write output control signal includes first and second write output control signals; and
    wherein the I/O control signal generation circuit includes a write output control signal generation circuit that is configured to sequentially and repeatedly generate the first and second write output control signals whenever the write flag is generated.

8. The semiconductor device of claim 4,
    wherein the internal write output control signal includes first and second internal write output control signals; and
    wherein the I/O control signal generation circuit includes an internal write output control signal generation circuit that is configured to sequentially and repeatedly generate the first and second internal write output control signals whenever the internal write flag is generated while a write operation is performed in a bank group mode, in which a column operation is executed before and after a bubble period, and
    wherein the bubble period is a duration of an other column operation.

9. The semiconductor device of claim 4,
    wherein the pipe circuit is synchronized with the write input control signal to latch the internal command/address signal; and
    wherein the pipe circuit is synchronized with the write output control signal to output the latched internal command/address signal as a write latch signal and is synchronized with the internal write output control signal to output the latched internal command/address signal as an internal write latch signal.

10. The semiconductor device of claim 9, wherein the auto-pre-charge signal generation circuit generates a write auto-pre-charge signal based on the internal write latch signal in a bank group mode that a column operation is executed before and after a bubble period.

11. The semiconductor device of claim 10, wherein the auto-pre-charge signal generation circuit generates the write auto-pre-charge signal based on the write latch signal if the semiconductor device is put out of the bank group mode.

12. The semiconductor device of claim 9, wherein the auto-pre-charge signal generation circuit includes:
   a selection signal generation circuit configured to generate a write selection signal and an internal write selection signal based the write output control signal and the internal write output control signal;
   a pre-charge signal generation circuit configured to generate a pre-charge signal and an internal pre-charge signal from the write latch signal and the internal write latch signal based on the write selection signal and the internal write selection signal; and
   an auto-pre-charge signal output circuit configured to a write auto-pre-charge signal based on the pre-charge signal and the internal pre-charge signal.

13. The semiconductor device of claim 1,
   wherein the input control signal includes a read input control signal;
   wherein the output control signal includes a read output control signal;
   wherein the internal output control signal includes an internal read output control signal; and
   wherein the I/O control signal generation circuit generates the read input control signal based on a read signal and generates the read output control signal and the internal read output control signal based on a read flag and an internal read flag.

14. The semiconductor device of claim 13,
   wherein the pipe circuit is synchronized with the read input control signal to latch the internal command/address signal; and
   wherein the pipe circuit is synchronized with the read output control signal to output the latched internal command/address signal as a read latch signal and is synchronized with the internal read output control signal to output the latched internal command/address signal as an internal read latch signal.

15. The semiconductor device of claim 14,
   wherein the auto-pre-charge signal generation circuit generates a read auto-pre-charge signal based on the internal read latch signal in a bank group mode that a column operation is executed before and after a bubble period; and
   wherein the auto-pre-charge signal generation circuit generates the read auto-pre-charge signal based on the read latch signal if the semiconductor device is put out of the bank group mode.

16. A semiconductor device comprising:
   an input/output (I/O) control signal generation circuit configured to generate a write input control signal based on a write signal and configured to generate a write output control signal and an internal write output control signal based on a write flag and an internal write flag;
   a pipe circuit configured to be synchronized with the write input control signal to latch an internal command/address signal and configured to be synchronized with the write output control signal to output the latched internal command/address signal as a write latch signal and configured to be synchronized with the internal write output control signal to output the latched internal command/address signal as an internal write latch signal; and
   an auto-pre-charge signal generation circuit configured to generate a write auto-pre-charge signal based on the internal write latch signal in a bank group mode, in which a column operation is executed before and after a bubble period and configured to generate the write auto-pre-charge signal based on the write latch signal when the semiconductor device shifts to a different bank mode.

17. The semiconductor device of claim 16, wherein the I/O control signal generation circuit generates the internal write output control signal in the bank group mode, and
   wherein the bubble period is a duration of an other column operation.

18. The semiconductor device of claim 17,
   wherein the internal write output control signal includes first and second internal write output control signals; and
   wherein the I/O control signal generation circuit includes an internal write output control signal generation circuit that is configured to sequentially and repeatedly generate the first and second internal write output control signals whenever the internal write flag is generated.

19. The semiconductor device of claim 16,
   wherein the I/O control signal generation circuit generates a read input control signal based on a read signal and generates a read output control signal and an internal read output control signal based on a read flag and an internal read flag;
   wherein the pipe circuit is synchronized with the read input control signal to latch the internal command/address signal and is synchronized with the read output control signal to output the latched internal command/address signal as a read latch signal and is synchronized with the internal read output control signal to output the latched internal command/address signal as an internal read latch signal; and
   wherein the auto-pre-charge signal generation circuit generates a read auto-pre-charge signal based on the read latch signal and the internal read latch signal.

20. A semiconductor device comprising:
   an input/output (I/O) control signal generation circuit configured to generate a read input control signal based on a read signal and configured to generate a read output control signal and an internal read output control signal based on a read flag and an internal read flag;
   a pipe circuit configured to be synchronized with the read input control signal to latch an internal command/address signal and configured to be synchronized with the read output control signal to output the latched internal command/address signal as a read latch signal and configured to be synchronized with the internal read output control signal to output the latched internal command/address signal as an internal read latch signal; and
   an auto-pre-charge signal generation circuit configured to generate a read auto-pre-charge signal based on the internal read latch signal in a bank group mode, in which a column operation is executed before and after a bubble period and configured to generate the read auto-pre-charge signal based on the read latch signal if the semiconductor device shifts to a different bank mode.

* * * * *